United States Patent
Uozumi et al.

(10) Patent No.: US 12,181,345 B2
(45) Date of Patent: Dec. 31, 2024

(54) METHOD OF CALIBRATING RADIATION THERMOMETER AND SYSTEM THEREOF

(71) Applicant: EBARA CORPORATION, Tokyo (JP)

(72) Inventors: Shuji Uozumi, Tokyo (JP); Yasuyuki Motoshima, Tokyo (JP)

(73) Assignee: EBARA CORPORATION, Tokyo (JP)

(*) Notice: Subject to any disclaimer, the term of this patent is extended or adjusted under 35 U.S.C. 154(b) by 507 days.

(21) Appl. No.: 17/614,210

(22) PCT Filed: May 29, 2020

(86) PCT No.: PCT/JP2020/021421
§ 371 (c)(1),
(2) Date: Nov. 24, 2021

(87) PCT Pub. No.: WO2020/241850
PCT Pub. Date: Dec. 3, 2020

(65) Prior Publication Data
US 2022/0228924 A1    Jul. 21, 2022

(30) Foreign Application Priority Data

May 31, 2019 (JP) .................. 2019-102253
May 15, 2020 (JP) .................. 2020-085788

(51) Int. Cl.
*G01J 5/80* (2022.01)
*B24B 37/015* (2012.01)
(Continued)

(52) U.S. Cl.
CPC ............ *G01J 5/802* (2022.01); *B24B 37/015* (2013.01); *G01J 5/12* (2013.01); *H01L 21/67248* (2013.01)

(58) Field of Classification Search
CPC ............ G01J 5/802; G01J 5/12; B24B 31/015
See application file for complete search history.

(56) References Cited

U.S. PATENT DOCUMENTS 5,127,742 A    7/1992   Fraden
6,179,465 B1   1/2001   Yam

FOREIGN PATENT DOCUMENTS

JP    H04-303931 A    10/1992
JP    H05-296843 A    11/1993
(Continued)

OTHER PUBLICATIONS

International Patent Application No. PCT/JP2020/021421; Int'l Search Report; dated Aug. 18, 2020; 6 pages.

*Primary Examiner* — Mirellys Jagan
(74) *Attorney, Agent, or Firm* — BakerHostetler

(57) ABSTRACT

The present invention relates to a method and a system of automatically calibrating a radiation thermometer disposed in a polishing apparatus. This method includes: placing a heating device (61), to which a measurement body (68) is attached, below the radiation thermometer (48); and using a controller (40) of the polishing apparatus coupled to the heating device (61) to heat a temperature of the measurement body (68) to a plurality of target temperatures (Ta), to measure the temperatures of the measurement body (68) at each target temperature (Ta) with the radiation thermometer (48), to calculate temperature deviation amounts which are differences between each of the target temperatures (Ta) and temperature output values of the radiation thermometer (48) corresponding to each target temperature (Ta), and to calibrate the radiation thermometer (48) so that all the temperature deviation amounts are within a preset reference range.

16 Claims, 20 Drawing Sheets

(51) Int. Cl.
*G01J 5/12* (2006.01)
*H01L 21/67* (2006.01)

(56) References Cited

FOREIGN PATENT DOCUMENTS

| | | | |
|---|---|---|---|
| JP | H07-029427 U | | 6/1995 |
| JP | 2000-515638 A | | 11/2000 |
| JP | 2000-337967 A | | 12/2000 |
| JP | 2002-301660 A | | 10/2002 |
| JP | 2004-085685 A | | 3/2004 |
| JP | 2005-311246 A | | 11/2005 |
| JP | 2013170946 A | * | 9/2013 |
| JP | 2018-027582 A | | 2/2018 |
| KR | 20100122465 A | * | 11/2010 |

* cited by examiner

METHOD OF CALIBRATING RADIATION THERMOMETER AND SYSTEM THEREOF

TECHNICAL FIELD

The present invention relates to a method of calibrating a radiation thermometer and a system thereof, particularly relates to a method and a system of automatically calibrating a radiation thermometer disposed in a polishing apparatus.

BACKGROUND ART

A CMP (Chemical Mechanical Polishing) apparatus is used in a process of polishing a surface of a substrate, such as a wafer, in the manufacturing of a semiconductor device. The CMP apparatus has at least one polishing unit, and the polishing unit is configured to hold and rotate the substrate with a polishing head, and press the wafer against a polishing pad on a rotating polishing table to polish the surface of the substrate. During polishing, a polishing liquid (or slurry) is supplied onto the polishing pad, so that the surface of the substrate is planarized by the chemical action of the polishing liquid and the mechanical action of abrasive grains contained in the polishing liquid.

A polishing rate of the substrate depends not only on a polishing load on the substrate pressed against the polishing pad, but also on a surface temperature of the polishing pad. This is because the chemical action of the polishing liquid on the substrate depends on the temperature. Therefore, in the manufacturing of a semiconductor device, it is important to maintain an optimum surface temperature of the polishing pad during polishing of the substrate in order to increase the polishing rate of the substrate, and to keep the increased polishing rate constant.

From this viewpoint, a pad-temperature regulating apparatus is conventionally used to regulate a surface temperature of a polishing pad (for example, see Patent Document 1). The pad-temperature regulating apparatus typically includes a heat exchanger capable of contacting a surface of the polishing pad, a liquid supply system for supplying a heating liquid having a regulated temperature and a cooling liquid having a regulated temperature into the heat exchanger, a radiation thermometer for measuring a surface temperature of the polishing pad, and a controller for controlling the liquid supply system based on the surface temperature of the polishing pad measured by the radiation thermometer. The controller controls flow rates of the heating liquid and the cooling liquid based on the surface temperature of the polishing pad measured by the radiation thermometer so that the surface temperature of the polishing pad is maintained at a predetermined target temperature.

The polishing apparatus may include a radiation thermometer that is different from the radiation thermometer of the pad-temperature regulating apparatus. This other radiation thermometer is, for example, a thermometer for monitoring whether or not the surface temperature of the polishing pad in the vicinity of the polishing head is maintained at a predetermined set temperature during polishing of the substrate. The other radiation thermometer is also connected to the above-mentioned controller. When measured values of the surface temperature of the polishing pad transmitted from the other radiation thermometer exceed an allowable range stored in advance in the controller, the controller stops an operation of the polishing apparatus, and issues an alarm. This prevents a polishing abnormality from occurring in the substrate.

In order to maintain the polishing rate of the substrate constant, and to effectively prevent the polishing abnormalities from occurring in the substrate, the radiation thermometer is required to output an accurate measurement of the pad surface temperature to the controller. For this reason, the manufacturer of the polishing apparatus performs calibrations of the radiation thermometer before shipping the polishing apparatus.

The calibration of a conventional radiation thermometer is performed as follows. First, an operator who calibrates the radiation thermometer prepares a heating device, such as a hot plate, and a portable radiation thermometer. Next, a heat radiation surface of the heating device is heated to a predetermined target temperature, and a temperature of the heat radiation surface is measured by both the radiation thermometer placed in the polishing apparatus, and the portable radiation thermometer. The operator then calibrates the radiation thermometer so that measured values of the radiation thermometer match measured values of the portable radiation thermometer.

Patent Literature

Patent document 1: Japanese laid-open patent publication No. 2018-027582

SUMMARY OF INVENTION

Technical Problem

After a certain amount of time has passed since the radiation thermometer has been in use, the measured value of the radiation thermometer (i.e, the temperature output value of the radiation thermometer) may deviate from the actual surface temperature of the polishing pad. Accordingly, it is preferable that the radiation thermometer be calibrated periodically at the customer's site even after delivery of the polishing apparatus.

However, the conventional calibration work of radiation thermometer is a work that requires some large amount of labor, and it is practically difficult to calibrate the radiation thermometer periodically because the polishing apparatus is stopped during the calibration work. Further, in the conventional calibration work of radiation thermometer, a portable radiation thermometer handled by the operator is used as a standard for calibrating the radiation thermometer of the polishing apparatus. In this case, calibration results of radiation thermometer may vary depending on a skill level of the operator. For example, if an angle at which the operator points the portable thermometer to the heat radiation surface of the heating device, and the distance between the portable thermometer and the heat radiation surface of the heating device change, the calibration results of the radiation thermometer may vary. Therefore, there is a need tier a method and a system that can automatically calibrate the radiation thermometer, and in particular, a method and a system that can perform the calibration of radiation thermometer in a short time and automatically.

It is therefore an object of the present invention to provide a method and a system of automatically calibrating a radiation thermometer disposed in a polishing apparatus.

Solution to Problem

In an of embodiment, there is provided a method of automatically calibrating a radiation thermometer disposed in a polishing apparatus, comprising: placing a heating device, to which a measurement body is attached, below the radiation thermometer; and using a controller of the polishing apparatus coupled to the heating device to heat a temperature of the measurement body to a plurality of target temperatures, to measure the temperatures of the measurement body at each target temperature with the radiation thermometer, to calculate temperature deviation amounts which are differences between each of the target temperatures and temperature output values of the radiation thermometer corresponding to each target temperature, and to calibrate the radiation thermometer so that all the temperature deviation amounts are within a preset reference range.

In an embodiment, there is provided a method of automatically calibrating a radiation thermometer disposed in a polishing apparatus, comprising: preparing a plurality of heating devices each of which has a measurement body attached thereto; and using a controller of the polishing apparatus coupled to the plurality of heating devices to heat a temperature of each measurement body to a predetermined target temperature, to move each measurement body below the radiation thermometer to measure a temperature of each measurement body at the target temperature with the radiation thermometer, to calculate temperature deviation amounts which are differences between each of the target temperatures and temperature output values of the radiation thermometer corresponding to each target temperature, and to calibrate the radiation thermometer so that all the temperature deviation amounts are within a preset reference range.

In an embodiment, calibrating the radiation thermometer is correcting a conversion parameter stored in an analog-digital converter of the radiation thermometer.

In an embodiment, the method further comprises: after calibrating the radiation thermometer, heating again the temperature of the measurement body to the plurality of target temperatures; measuring the temperature of the measurement body at each target temperature with the radiation thermometer; calculating again the temperature deviation amounts; and checking whether or not all the temperature deviation amounts are within the preset reference range.

In an embodiment, the measurement body is made of a material having an emissivity similar to an emissivity of the polishing pad.

In an embodiment, there is provided A method of automatically calibrating a radiation thermometer disposed in a polishing apparatus, comprising: placing a heating device to which a plurality of measurement bodies having known emissivities different from each other are attached, below the radiation thermometer; and using a controller of the polishing apparatus coupled to the heating device to heat temperatures of the plurality of measurement bodies to a predetermined target temperature, to measure the temperatures of the plurality of measurement bodies heated to the predetermined target temperature with the radiation thermometer, respectively, to calculate temperature deviation amounts which are differences between each of the temperature expectation values to be output from the radiation thermometer when the measurement bodies heated to the predetermined target temperature are measured by the radiation thermometer, and each of the temperature output values of the radiation thermometer, and to calibrate the radiation thermometer so that all the temperature deviation amounts are within a preset reference range.

In an embodiment, calibrating the radiation thermometer is correcting a conversion parameter stored in an analog-digital converter of the radiation thermometer.

In an embodiment, the method further comprises: after calibrating the radiation thermometer, measuring again the temperatures of the plurality of measurement bodies whose temperature are maintained at the target temperature, with the radiation thermometer; calculating again the temperature deviation amounts; and checking whether or not all the temperature deviation amounts are within the preset reference range.

In an embodiment, there is provided a calibration system for calibrating a radiation thermometer disposed in a polishing apparatus, comprising: a heating device to which a measurement body is attached, and which is placed below the radiation thermometer; and a temperature regulator coupled to the heating device, wherein the temperature regulator is coupled to a controller disposed in the polishing apparatus, and the controller is configured: to heat a temperature of the measurement body to a plurality of target temperatures through the temperature regulator, to measure the temperatures of the measurement body at each target temperature with the radiation thermometer, to calculate temperature deviation amounts which are differences between each of the target temperatures and temperature output values of the radiation thermometer corresponding to each target temperature, and to calibrate the radiation thermometer so that all the temperature deviation amounts are within a preset reference range.

In an embodiment, there is provided a calibration system for calibrating a radiation thermometer disposed in a polishing apparatus, comprising: a plurality of heating devices each of which has a measurement body attached thereto; a temperature regulator coupled to the plurality of heating devices, and a heating-device moving mechanism configured to move each of the plurality of heating devices below the radiation thermometer, wherein the temperature regulator and the heating-device moving mechanism are coupled to a controller disposed in the polishing apparatus, and the controller is configured to heat a temperature of each measurement body to a predetermined target temperature, to use the heating-device moving mechanism to each measurement body below the radiation thermometer, to measure the temperature of each measurement body at the target temperature with the radiation thermometer, to calculate temperature deviation amounts which are differences between each of the target temperatures and temperature output values of the radiation thermometer corresponding to each target temperature, and to calibrate the radiation thermometer so that all the temperature deviation amounts are within a preset reference range.

In an embodiment, the controller is configured to correct a conversion parameter stored in an analog-digital converter of the radiation thermometer.

In an embodiment, the controller is configured to, after calibrating the radiation thermometer, heat again the temperature of the measurement body to the plurality of target temperatures; to measure the temperature of the measurement body at each target temperature with the radiation thermometer; to calculate again the temperature deviation amounts; and to check whether or not all the temperature deviation amounts are within the preset reference range.

In an embodiment, the measurement body is made of a material having an emissivity similar to an emissivity of the polishing pad, In an embodiment, there is provided a calibration system for calibrating a radiation thermometer disposed in a polishing apparatus, comprising: a heating device to which a plurality of measurement bodies having known emissivities different from each other are attached, and which is placed below the radiation thermometer; and a temperature regulator coupled to the heating device, wherein the temperature regulator is coupled to a controller disposed in the polishing apparatus, and the controller is configure to heat temperatures of the plurality of measurement bodies to a predetermined target temperature, to measure the temperatures of the plurality of measurement bodies heated to the predetermined target temperature with the radiation thermometer, respectively, to calculate temperature deviation amounts which are differences between each of the temperature expectation values to be output from the radiation thermometer when the measurement bodies heated to the predetermined target temperature are measured by the radiation thermometer, and each of the temperature output values of the radiation thermometer, and to calibrate the radiation thermometer so that all the temperature deviation amounts are within a preset reference range.

In an embodiment, the controller is configured to correct a conversion parameter stored in an analog-digital converter of the radiation thermometer.

In an embodiment, the controller is configured to, after calibrating the radiation thermometer, heat the temperatures of the plurality of measurement bodies to the plurality of target temperatures; to measure again the temperatures of the plurality of measurement bodies whose temperature are maintained at the target temperature, with the radiation thermometer; to calculate again the temperature deviation amounts; and checking whether or not all the temperature deviation amounts are within the preset reference range.

Advantageous Effects of Invention

According to the present invention, simply by placing the heating device, to which the measurement body is attached, below the radiation thermometer, and connecting the controller of the polishing apparatus to the heating device, the controller automatically performs the calibration of the radiation thermometer. Therefore, the burden on the operator and the downtime of the polishing apparatus are reduced, and thus it can be expected that the calibration process of the radiation thermometer is periodically performed. As a result, it is possible to polish the substrate at the desired polishing rate, and furthermore, the substrate can be polished at a desired polishing rate, and further, the occurrence of polishing abnormalities on the substrate can be effectively prevented.

DESCRIPTION OF EMBODIMENTS

Figure 1:
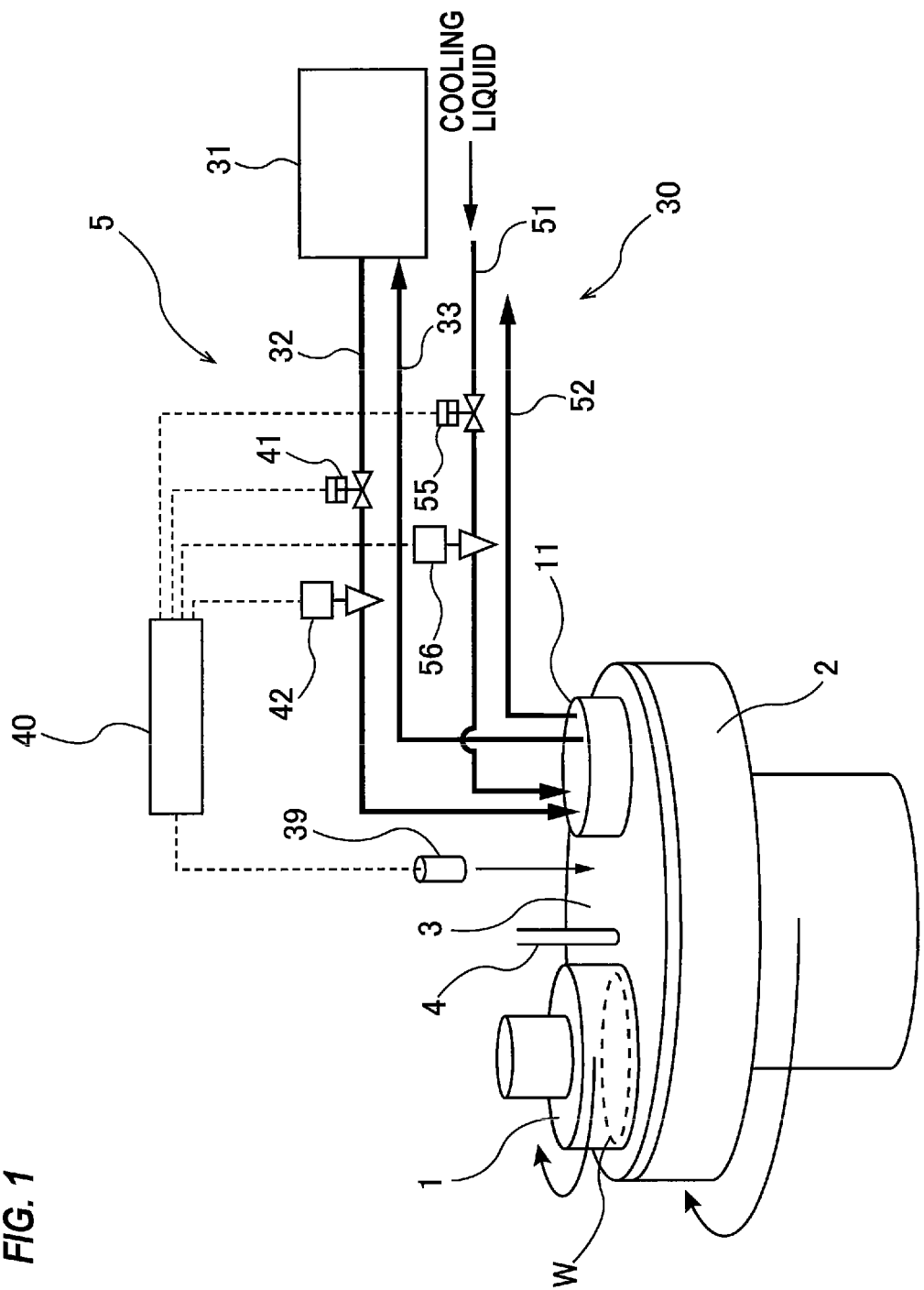
FIG. 1 is a schematic view showing a polishing apparatus according to one embodiment.

Embodiments of the present invention will now be described with reference to the drawings.
FIG. 1 is a schematic view showing a polishing apparatus according to one embodiment. The polishing apparatus shown in FIG. 1 includes a polishing head 1 for holding and rotating a wafer W which is an example of a substrate, a polishing table 2 that supports a polishing pad 3, a polishing-liquid supply nozzle 4 for supplying a polishing liquid (e.g. a slurry) onto a surface of the polishing pad 3, and a pad-temperature regulating apparatus 5 for regulating a surface temperature of the polishing pad 3. The surface (upper surface) of the polishing pad 3 provides a polishing surface for polishing the wafer W.

The polishing head 1 is vertically movable, and is rotatable about its axis in a direction indicated by arrow. The water W is held on a lower surface of the polishing head 1 by, for example, vacuum suction. A motor (not shown) is coupled to the polishing table 2, so that the polishing table 2 can rotate in a direction indicated by arrow. As shown in FIG. 1, the polishing head 1 and the polishing table 2 rotate in the same direction. The polishing pad 3 is attached to an upper surface of the polishing table 2.

Polishing of the wafer W is performed in the following manner. The wafer W, to be polished, is held by the polishing head 1, and is then rotated by the polishing head 1. The polishing pad 3 is rotated together with the polishing table 2. In this state, the polishing liquid is supplied from the polishing-liquid supply nozzle 4 onto the surface of the polishing pad 3, and the surface of the wafer W is then pressed by the polishing head 1 against the surface (i.e. polishing surface) of the polishing pad 3. The surface of the wafer W is polished by the sliding contact with the polishing pad 3 in the presence of the polishing liquid. The surface of the wafer W is planarized by the chemical action of the polishing liquid and the mechanical action of abrasive grains contained in the polishing liquid.

The pad-temperature regulating apparatus 5 includes a heat exchanger 11 which can contact the surface of the polishing pad 3, and a liquid supply system 30 for supplying a heating liquid having a regulated temperature and a cooling liquid having a regulated temperature into the heat exchanger 11. This liquid supply system 30 includes a heating-liquid supply tank 31 as a heating-liquid supply source for storing the heating liquid having a regulated temperature, and a heating-liquid supply pipe 32 and a heating-liquid return pipe 33, each coupling the heating-liquid supply tank 31 to the heat exchanger 11. One ends of the heating-liquid supply pipe 32 and the heating-liquid return pipe 33 are coupled to the heating-liquid supply tank 31, while the other ends are coupled to the heat exchanger 11.

The heating liquid having a regulated temperature is supplied from the heating-liquid supply tank 31 to the heat exchanger 11 through the heating-liquid supply pipe 32, flows in the heat exchanger 11, and is retuned from the heat exchanger 11 to the heating-liquid supply tank 31 through the heating-liquid return pipe 33. In this manner, the heating liquid circulates between the heating-liquid supply tank 31 and the heat exchanger 11. The heating-liquid supply tank 31 has a heater (not shown) disposed therein, this heater heating the heating liquid to a predetermined temperature.

A first on-off valve 41 and a first flow control valve 42 are attached to the heating-liquid supply pipe 32. The first flow control valve 42 is located between the heat exchanger 11 and the first on-off valve 41. The first on-off valve 41 is a valve not having a flow rate regulating function, whereas the first flow control valve 42 is a valve having a flow rate regulating function.

The liquid supply system 30 further includes a cooling-liquid supply pipe 51 and a cooling-liquid discharge pipe 52, both coupled to the exchanger 11. The cooling-liquid supply pipe 51 is coupled to a cooling-liquid supply source (e.g. a cold water supply source) provided in a factory in which the polishing apparatus is installed. The cooling liquid is supplied to the heat exchanger 11 through the cooling-liquid supply pipe 51, flows in the heart exchanger 11, and is drained from the heat exchanger 11 through the cooling-liquid discharge pipe 52. In one embodiment, the cooling liquid that has flowed through the heat exchanger 11 may be returned to the cooling-liquid supply source through the cooling-liquid discharge pipe 52.

A second on-off valve 55 and a second flow control valve 56 are attached to the cooling-liquid supply pipe 51. The second flow control valve 56 is located between the pad contact member 11 and the second on-off valve 55. The second on-off valve 55 is a valve not having a flow rate regulating function, whereas the second flow control valve 56 is a valve having a flow rate regulating function.

The pad-temperature regulating system 5 further includes a radiation thermometer 39 for measuring a surface temperature of the polishing pad 3 (which may hereinafter be referred to as pad surface temperature), and a controller 40 which operates the first flow control valve 42 and the second flow control valve 56 based on the pad surface temperature measured by the radiation thermometer 39, The first on-off valve 41 and the second on-off valve 55 are usually open.

The radiation thermometer 39 measures the pad surface temperature in a non-contact manner, and sends a measured value of the pad surface temperature to the controller 40. The controller 40 operates the first flow-rate control valve 42 and the second flow-rate control valve 56 to control the flow rates of the heating fluid and the cooling fluid based on the measured pad surface temperature so that the pad surface temperature is maintained at a preset target temperature. The first flow-rate control valve 42 and the second flow-rate control valve 56 operate according to control signals from the controller 40 to regulate the flow rate of the heating liquid and the flow rate of the cooling liquid to be supplied to the heat exchanger 11. The heat exchange is performed between the heating and cooling liquids flowing through the heat exchanger H and the polishing pad 3. As a result, the pad surface temperature changes.

By such feedback control, the surface temperature of the polishing pad 3 (i.e, the pad surface temperature) is maintained at a predetermined target temperature. In this embodiment, the controller 40 is configured to control operations of the polishing apparatus as a whole, including the pad-temperature regulating apparatus 5 and the polishing head 1. The target temperature of the polishing pad 3 is determined based on a type of the wafer W or a polishing process. The determined target temperature is input in advance to the controller 40.

In order to maintain the pad surface temperature at the predetermined target temperature, the heat exchanger 11 is placed in contact with the surface (i.e. the polishing surface) of the polishing pad 3 during polishing of the wafer W. In this specification, the manner of contact of the heat exchanger 11 with the surface of the polishing pad 3 includes not only direct contact of the heat exchanger 11 with the surface of the polishing pad 3, but also contact of the heat exchanger 11 with the surface of the polishing pad 3 in the presence of a polishing liquid (or slurry) between the heat exchanger 11 and the surface of the polishing pad 3. In either case, heat exchange occurs between the polishing pad 3 and the heating liquid and cooling liquid, flowing in the heat exchanger 11, whereby the pad surface temperature is controlled.

Hot water may be used as the heating liquid to be supplied to the heat exchanger 11, When it is intended to raise the surface temperature of the polishing pad 3 more quickly, a silicone oil may be used as the heating liquid. Cold water or a silicone oil may be used as the cooling liquid to be supplied to the heat exchanger 11. In the case of using a silicone oil as the cooling liquid, the polishing pad 3 can be cooled quickly by coupling a chiller as a cooling-liquid supply source to the cooling-liquid supply pipe 51, and by cooling the silicone oil to a temperature of not more than 0° C. Pure water can be used as the cold water. In order to cool pure water to produce cold water, a chiller may be used as a cooling-liquid supply source. In this case, cold water that has flowed through the heat exchanger H may be returned to the chiller through the cooling-liquid discharge pipe 52.

The heating-liquid supply pipe 32 and the cooling-liquid supply pipe 51 are completely independent pipes. Thus, the heating liquid and the cooling liquid can be simultaneously supplied to the heat exchanger H without mixing with each other. The heating-liquid return pipe 33 and the cooling-liquid discharge pipe 52 are also completely independent pipes. Thus, the heating liquid is returned to the heating-liquid supply tank 31 without mixing with the cooling liquid, while the cooling liquid is either drained or returned to the cooling-liquid supply source without mixing with the heating liquid.

Figure 2:
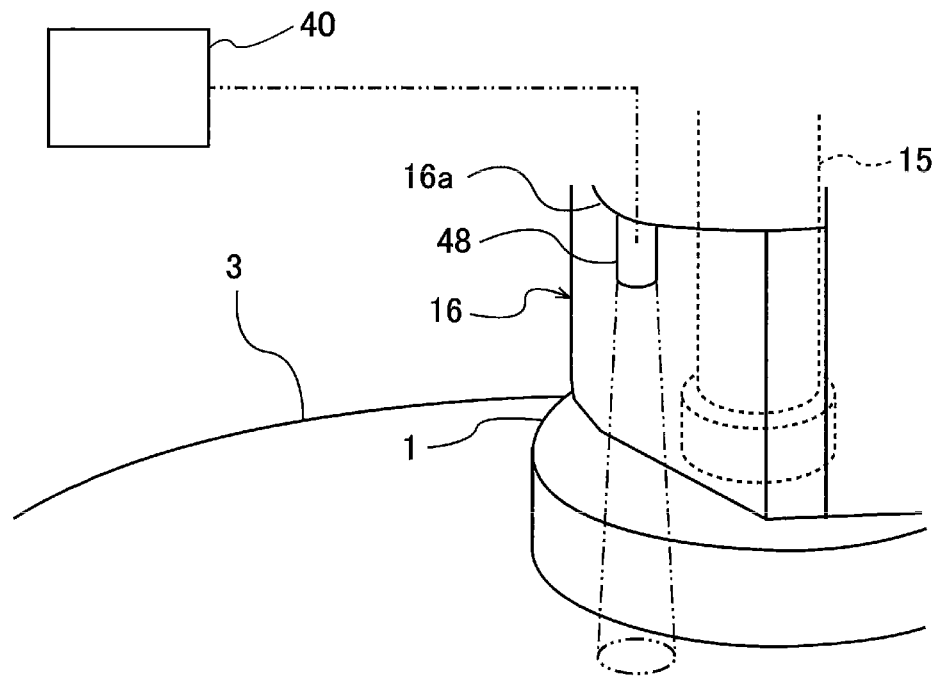
FIG. 2 is a schematic view showing a radiation thermometer for measuring a pad surface temperature in the vicinity of the polishing head.

The polishing apparatus according to this embodiment has a radiation thermometer for measuring the surface temperature (pad surface temperature) of the polishing pad 3 in the vicinity of the polishing head 1, FIG. 2 is a schematic view showing a radiation thermometer for measuring the pad surface temperature in the vicinity of the polishing head 1, As shown in FIG. 2, the polishing head 1 is coupled to a rotation shaft 15 which rotates the polishing head 1, and the rotation shaft 15 is surrounded by a cover 16. The cover 16 has a flange portion 16a protruding from an outer surface thereof, and a radiation thermometer 48 is attached to a lower surface of the flange portion 16a. In the following description, the radiation thermometer 39 may be referred to as a "first radiation thermometer 39", and the radiation thermometer 48 may be referred to as a "second radiation thermometer 48", The second radiation thermometer 48 measures the pad surface temperature in the vicinity of the polishing head 1 that is polishing the wafer W. The second radiation thermometer 48 is also connected to the controller 40, and the pad surface temperature measured by the second radiation thermometer 48 is sent to the controller 40. The controller 40 stores in advance an allowable range of the pad surface temperature with respect to the target temperature which is preset according to each of polishing processes. While the wafer W is being polished, the controller 40 monitors whether or not the measured values of the pad surface temperature sent from the second radiation thermometer 48 are within the allowable range. When the measured value of the pad surface temperature deviates from the allowable range, the controller 40 issues an alarm.

In one embodiment, the controller 40 may issue an alarm and together stop polishing of the wafer W. During polishing of the wafer W, the controller 40 monitors the pad surface temperature measured by the second radiation thermometer 48, thereby preventing a polishing abnormality from occurring in the wafer W.

Figure 3:
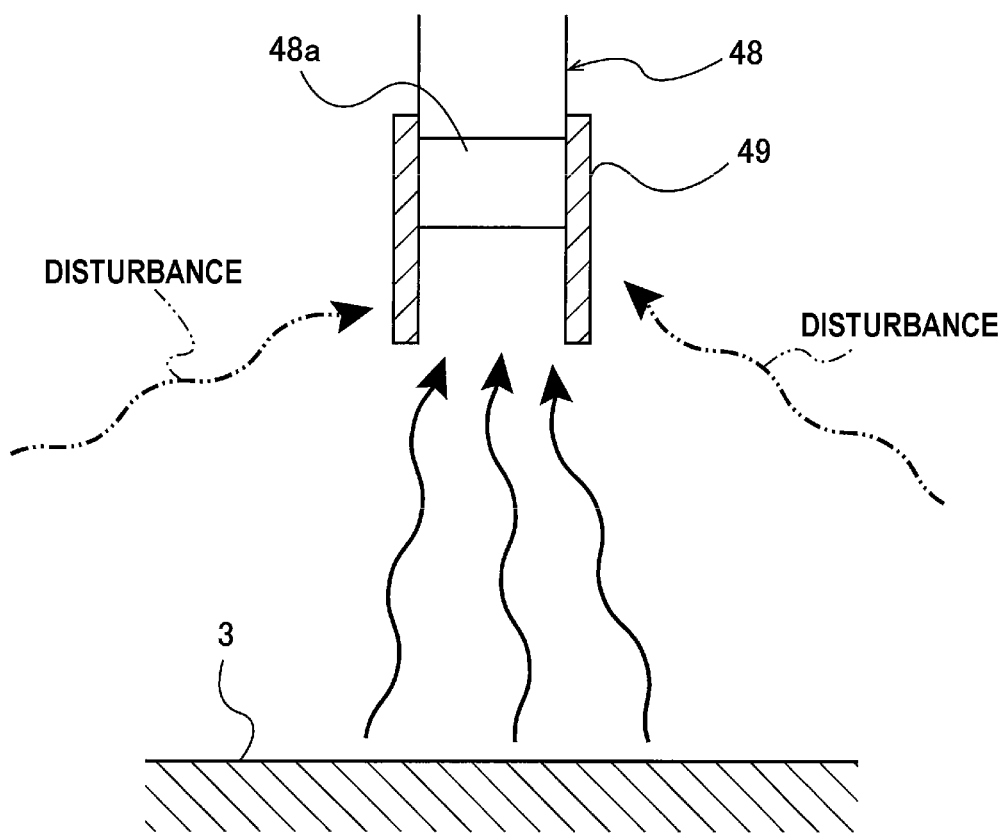
FIG. 3 is an enlarged schematic view showing a sensor unit of the radiation thermometer shown in FIG. 2.

FIG. 3 is an enlarged schematic view showing a sensor unit of the second radiation thermometer 48 shown in FIG. 2. Configuration of a sensor unit of the first radiation thermometer 39 is the same as the configuration of the sensor unit of the second radiation thermometer 48, and thus duplicate descriptions thereof are omitted.

Typically, a radiation thermometer measures an intensity (an amount of energy) of electromagnetic wave, such as ultraviolet rays, infrared rays, or visible rays, emitted from an object to be measured, and converts the intensity into temperature to thereby measure the temperature of the object to be measured. As shown in FIG. 3, the sensor unit 48a of the second radiation thermometer 48 faces the surface of the polishing pad 3 so that the electromagnetic waves emitted from the surface of the polishing pad 3, which is the object to be measured, effectively reach the sensor unit 48a. A tip of the sensor unit 48a is surrounded by a barrier 49, which is a member that prevents electromagnetic waves emitted from objects other than the polishing pad 3 from reaching the sensor unit 48a. The barrier 49 protects the second radiation thermometer 48 from disturbances, allowing accurate pad surface temperature to be measured.

After a certain period of time has passed since the start of use of the radiation thermometers 39 and 48, each of the output values of the radiation thermometers 39, 48 may deviates from the actual pad surface temperature. Therefore, the radiation thermometers 39, 48 are periodically calibrated using a calibration system, which will be described below. For example, the calibration process for each of radiation thermometers 39, 48 is performed during maintenance of the polishing apparatus, or after replacing of the polishing pad 3.

Figure 4:
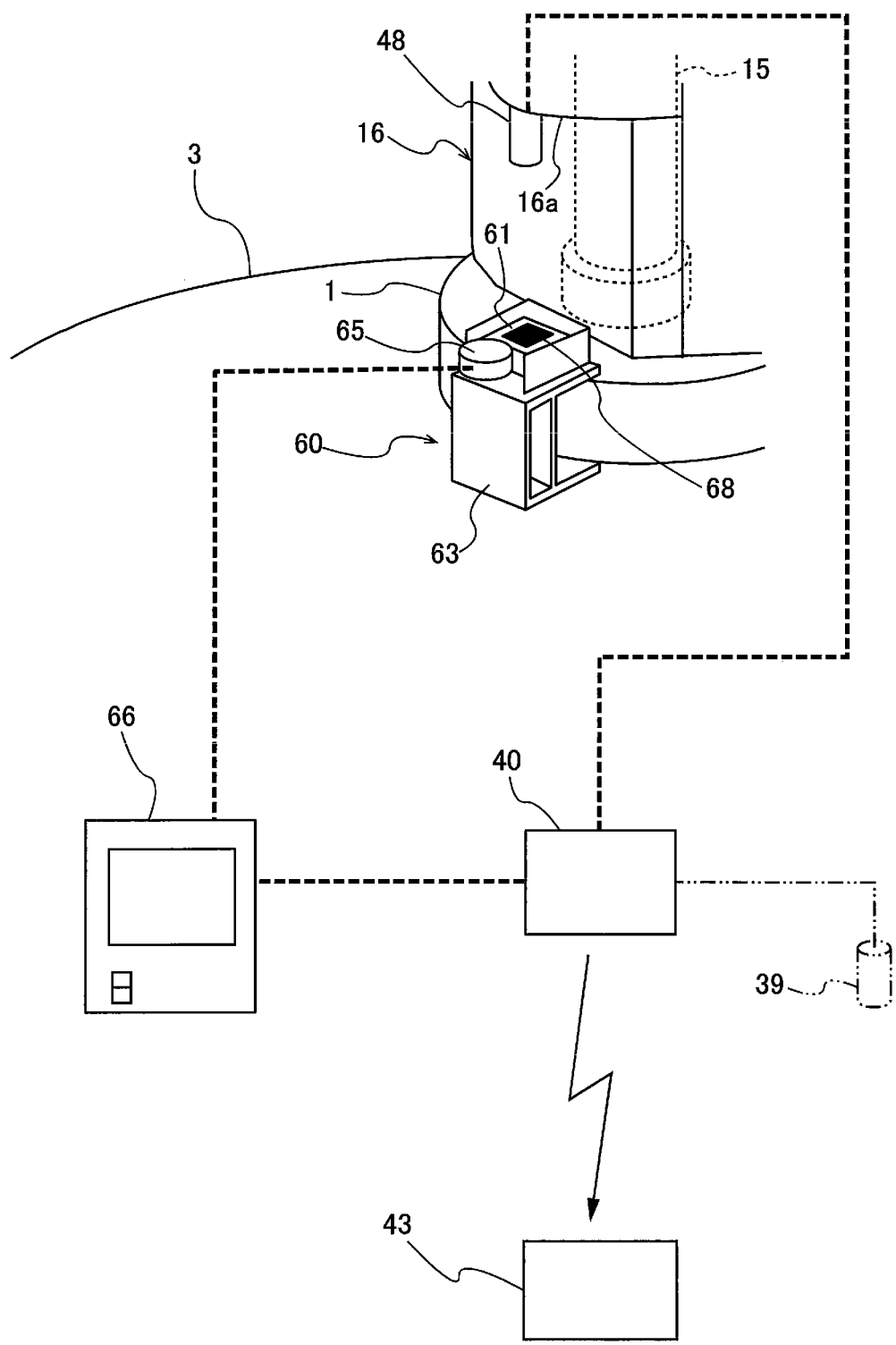
FIG. 4 is a schematic view showing a configuration of calibration system according to one embodiment.
Figure 5A:
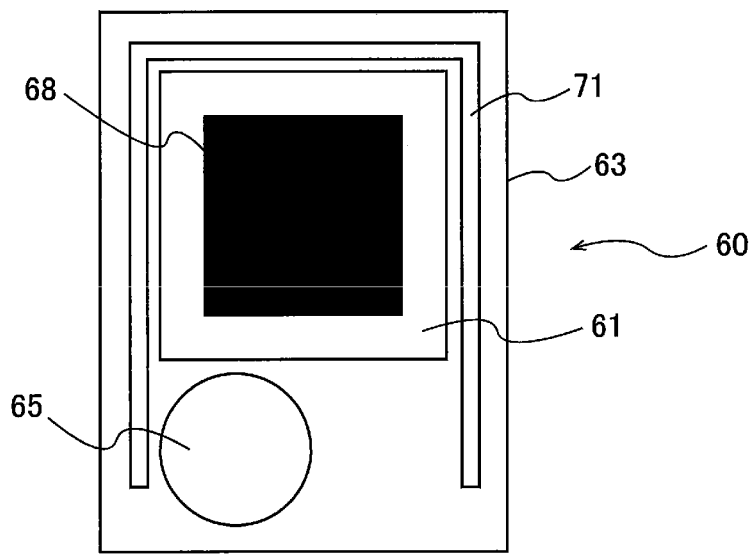
FIG. 5A is a top view schematically showing a calibration tool of the calibration system shown in FIG. 4.
Figure 5B:
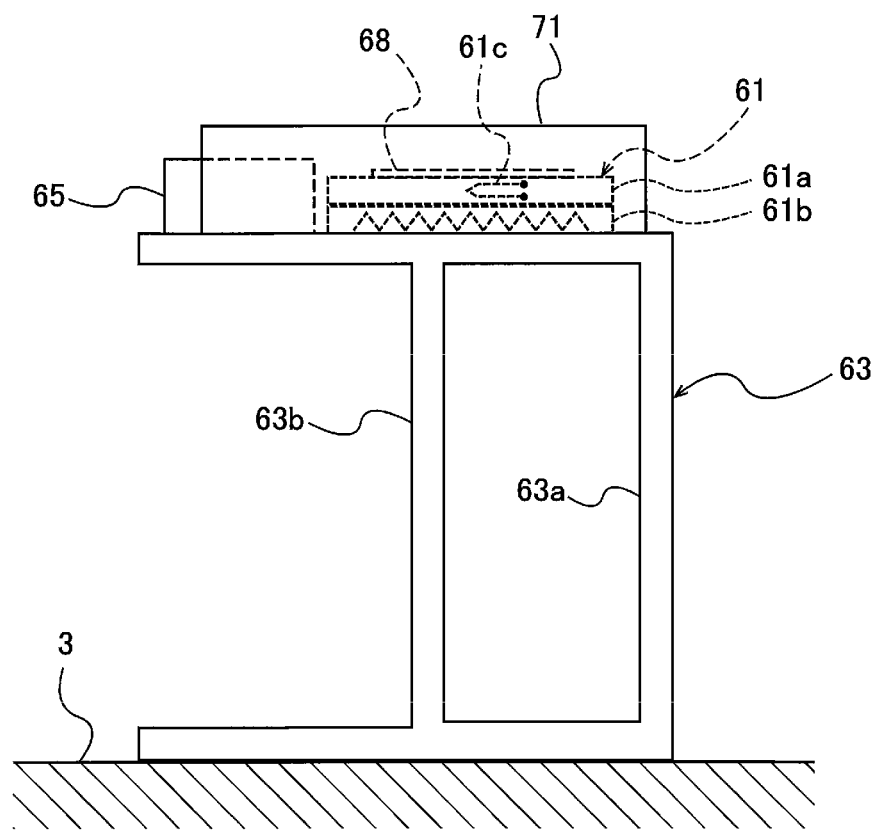
FIG. 5B is a side view of the calibration tool shown in FIG. 5A.

FIG. 4 is a schematic view showing a configuration of calibration system according to one embodiment. The calibration system shown in FIG. 4 is used to calibrate the first radiation thermometer 39 and the second radiation thermometer 48. FIG. 5A is a top view schematically showing a calibration tool of the calibration system shown in FIG. 4, and FIG. 5B is a side view of the calibration tool shown in FIG. 5A, The calibration system shown in FIG. 4 includes a calibration tool 60 placed below the second radiation thermometer 48, and a temperature regulator 66 coupled to the calibration tool 60. FIG. 4 illustrates an example in which the calibration tool 60 of the calibration system is placed below the second radiation thermometer 48. When performing the calibration process of the first radiation thermometer 39, the calibration tool 60 is placed below the first radiation thermometer 39.

As shown in FIGS. 5A and 5B, the calibration tool 60 includes a heating device 61, such as a hot plate, and a platform 63 for supporting the heating device 61. The heating device 61 includes a heating plate 61a, a heater 61b disposed under the heating plate 61a, and a temperature sensor 61c capable of measuring a temperature of the heating plate 61a, The heater 51b has an upper surface disposed so as to be in contact with lower surface of the heating plate 61a, and a lower surface secured to the platform 63. In one embodiment, the heater 61b may be arranged inside the heating plate 61a. In this case, a lower surface of the heating plate 61a is secured to the platform 63.

The calibration tool 60 is coupled to the temperature regulator 66 (see FIG. 4), The temperature regulator 66 controls operation of the heater 61b based on a temperature of the heating plate 61a output from the temperature sensor 61c of the heating device 61 (for example, PID control), thereby maintaining the temperature of the heating plate 61a at a predetermined target temperature. The temperature sensor 61c shown in FIG. 5B is a thermocouple. However, the type of the temperature sensor 61c is free-selected. For example, the temperature sensor 61c may be a platinum resistance thermometer, a thermistor thermometer, or a bimetal thermometer.

As shown in FIG. 5B, the platform 63 includes a main frame 63a having a substantially C-shaped cross section, and a reinforcing rib 63b. The main frame 63a is constructed of a main plate extending in a vertical direction, and two plate-shaped arms connected to both ends of the main plate and extending in a horizontal direction. The reinforcing rib 63b extends from one arm to the other arm, and the heating device 61 is secured to an upper surface of one arm. A lower surface of the other arm comes into contact with the polishing pad 3 when the platform 63 is placed on the polishing pad 3. The reinforcing rib 63b is a member for preventing the main frame 63a of the platform 63 from being bent by parts of the calibration tool 60, such as the heating device 61. When the platform 63 is placed on the polishing pad 3, the reinforcing rib 63b keeps the upper surface of the heating plate 61a horizontal. Further, the calibration tool 60 includes a frame body 71 which is secured to the platform 63 so as to surround the heating plate 61a of the heating device 61. The frame body 71 is a member for preventing the heating plate 61a from colliding with members for example, the polishing head 1) disposed in the polishing apparatus.

As described above, the conventional calibration of the radiation thermometer has been performed using the portable radiation thermometer held by an operator. In this embodiment, when the platform 63 is placed on the upper surface of the polishing pad 3 so that the upper surface of the heating plate 61a of the heating device 61 faces the second radiation thermometer 48, a distance between the heating device 61 and the second radiation thermometer 48 is always kept constant. Further, the upper surface of the heating plate 61a faces the sensor unit 48a of the second radiation thermometer 48 so as to be parallel to each other. Therefore, it is possible to avoid a problem that the calibration result varies depending on the skill level of operator.

As shown in FIG. 4, the temperature regulator 66 is connected to the controller 40 of the polishing apparatus, and is configured to be able to change the set temperature of the temperature regulator 66 based on an instruction from the controller 40. In other words, the controller 40 can regulate the temperature of the heating plate 61a of the heating device 61 to a desired target temperature through the temperature regulator 66.

The calibration tool 60 may have a cooling device capable of cooling the heating plate 61a of the heating device 61. In this embodiment, the cooling device of the calibration tool 60 is a cooling fan 65 capable of sending air to the heating plate 61a of the heating device 61. The cooling fan 65 is connected to the temperature regulator 66, and the temperature regulator 66 controls the operations of the heater 61b and the cooling fan 65 to regulate the temperature of the heating plate 61a to the desired target temperature. The air sent from the cooling fan 65 to the heating plate 61a enables the temperature of the heating plate 61a to be regulated more precisely. Further, in the initial stage of heating of the heating plate 61a, a so-called "overshoot phenomenon" may occur, in which the temperature of the heating plate 61a rises significantly above the target temperature. However, the air sent from the cooling fan 65 can quickly converge the overshoot phenomenon of the heating plate 61a, so that the time required to calibrate the second radiation thermometer 48 can be reduced.

Figure 6:
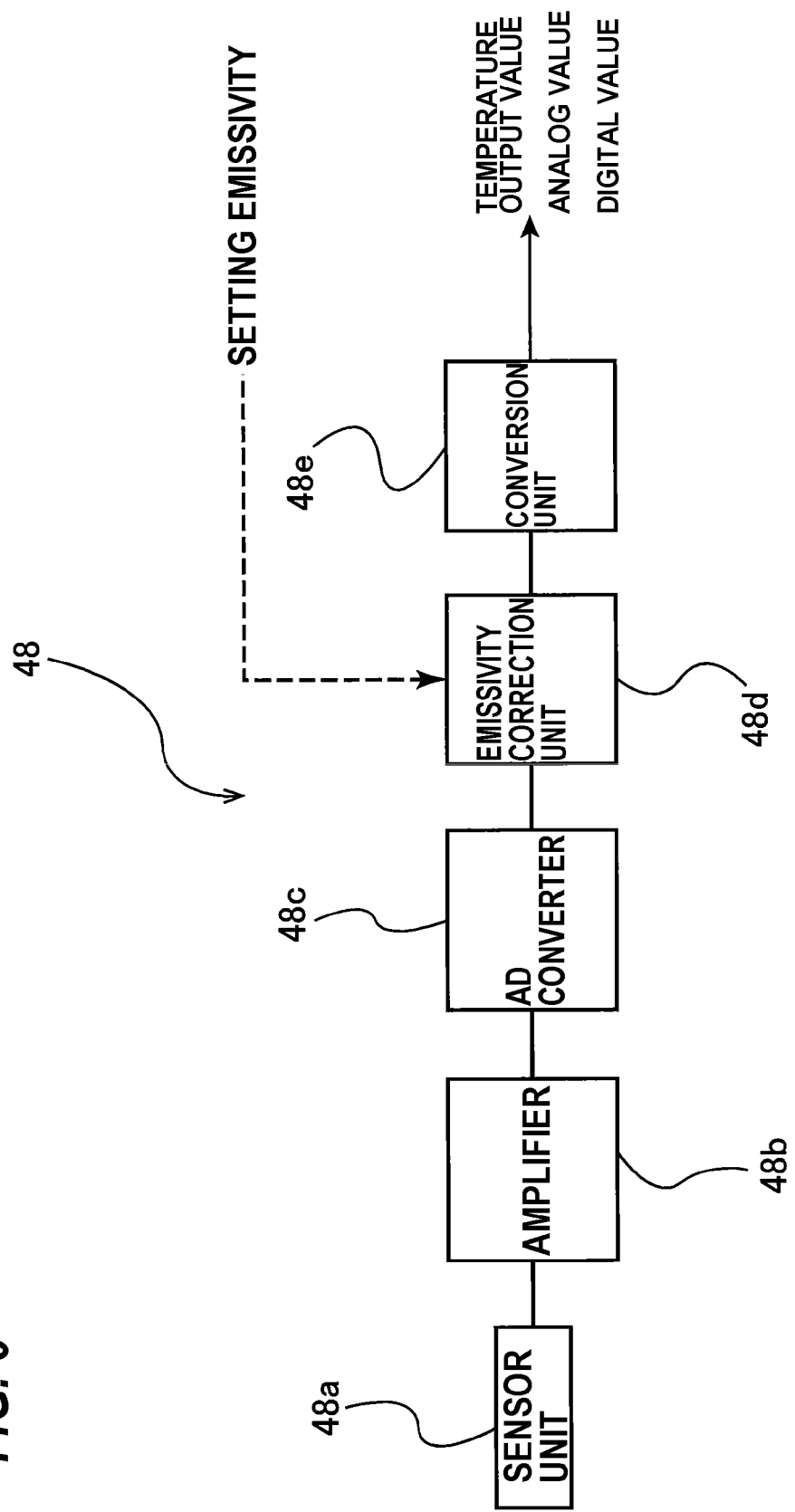
FIG. 6 is a schematic view showing an example of internal structure of the radiation thermometer.

FIG. 6 is a schematic view showing an example of internal structure of the second radiation thermometer 48. The first radiation thermometer 39 also has the same internal structure as the internal structure shown in FIG. 6, and thus duplicate descriptions thereof are omitted. As shown in FIG. 6, the second radiation thermometer 48 has a sensor unit 48a for measuring an intensity (an amount of energy) of electromagnetic wave, such as ultraviolet rays, infrared rays, or a visible rays, emitted from an object to be measured, an amplifier 48b for amplifying an analog signal value output from the sensor unit 48a, an analog-digital converter (AD converter) 48c for converting the analog signal value amplified by the amplifier 48b into a digital signal value, an emissivity correction unit 48d for correcting a digital signal value output from an analog-digital converter 48c based on an emissivity of the object to be measured, and a conversion unit 48e for converting the corrected digital signal value output from the emissivity correction unit 48d into a temperature of the object to be measured. In the second radiation thermometer 48 shown in FIG. 6, the sensor unit 48a, the amplifier 48b, the AD converter 48c, the emissivity correction unit 48d, and the conversion unit 48e are arranged in this order. However, this embodiment is not limited to this example. For example, in the second radiation thermometer 48, the sensor unit 48a, the amplifier 48b, the emissivity correction unit 48d, the AD converter 48c, and the conversion unit 48e may be arranged in this order.

In order for the second radiation thermometer 48 to accurately measure a temperature of the object to be measured, it is preferable to input in advance an emissivity of the object to be measured into the emissivity correction unit 48d of the second radiation thermometer 48. Therefore, in this embodiment, a measurement body 68 having a predetermined emissivity is attached to the upper surface of the heating plate 61a of the heating device 61 (see FIGS. 5A and 5B). When the heating plate 61a of the heating device 61 is heated by the heater 61b, a temperature of the measurement body 68 becomes the same as a temperature of the heating plate 61a. When calibrating the second radiation thermometer 48, a position of the calibration tool 60 is adjusted so that the measurement body 68 is located directly under the second radiation thermometer 48, and the second radiation thermometer 48 measures the temperature of the measurement body 68 having the same temperature as the heating plate 61a. In this case, the heat radiation surface of the heating device 61 measured by the second radiation thermometer 48 is a surface of the measurement body 68. Examples of the measurement body 68 include a blackbody tape having a known emissivity. In one embodiment, a blackbody paint having a known emissivity may be applied to the upper surface of the heating plate 61a to form the measurement body 68. The known emissivity of the blackbody tape or the blackbody paint is input to the emissivity correction unit 48d in advance. The emissivity correction mit 48d corrects the digital signal value output from the analog-digital converter 48c into a digital signal value that is a case where the emissivity of the measurement body 68 is a predetermined value (e.g, 1.0), based on the input emissivity of the measurement body 68.

In one embodiment, the emissivity of the measurement body 68 may be unknown. In this case, the emissivity correction unit 48d outputs the digital signal value output from the analog-digital converter 48c to the conversion unit 48e without any correction.

The measurement body 68 may be made of a material having an emissivity similar to that of the polishing pad 3. For example, the measurement body 68 made of the same resin as the polishing pad 3 may be attached to the upper surface of the heating plate 61a. Alternatively, the measurement body 68 may be omitted, and the heating plate 61a may be used as the measurement body whose temperature is measured by the second radiation thermometer 48. In this case, the heat radiation surface of the measurement body measured by the second radiation thermometer 48 is the surface (upper surface) of the heating plate 61a. Further, it is preferable that the heating plate 61a is made of the same resin as the polishing pad 3.

Next, a method of calibrating the second radiation thermometer 48 will be described. A method of calibrating the first radiation thermometer 39 is the same as the method of calibrating the second radiation thermometer 48, and thus duplicate descriptions thereof are omitted.

Figure 7:
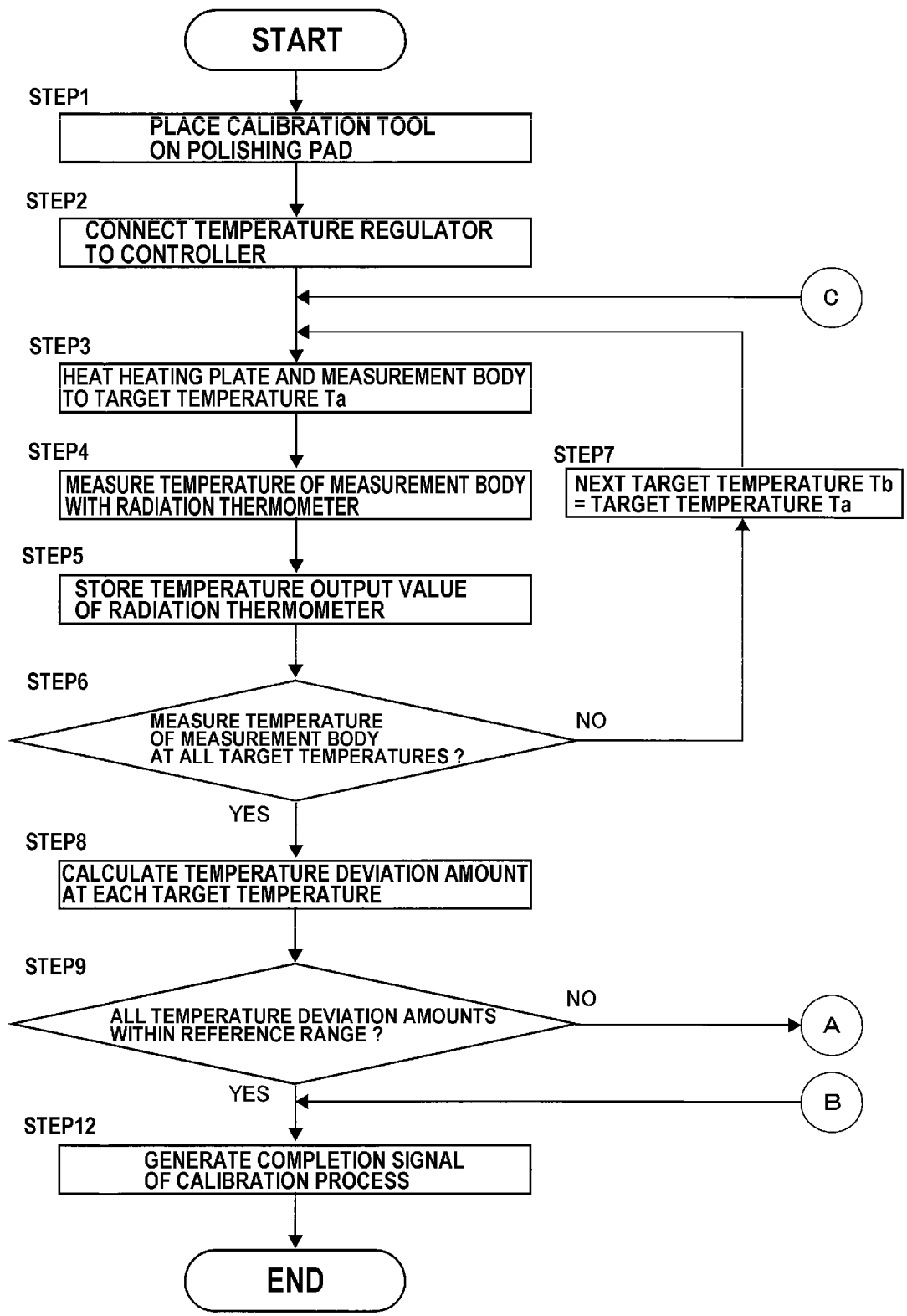
FIG. 7 is a flowchart showing a first half of a method of calibrating the radiation thermometer according to one embodiment.
Figure 8:
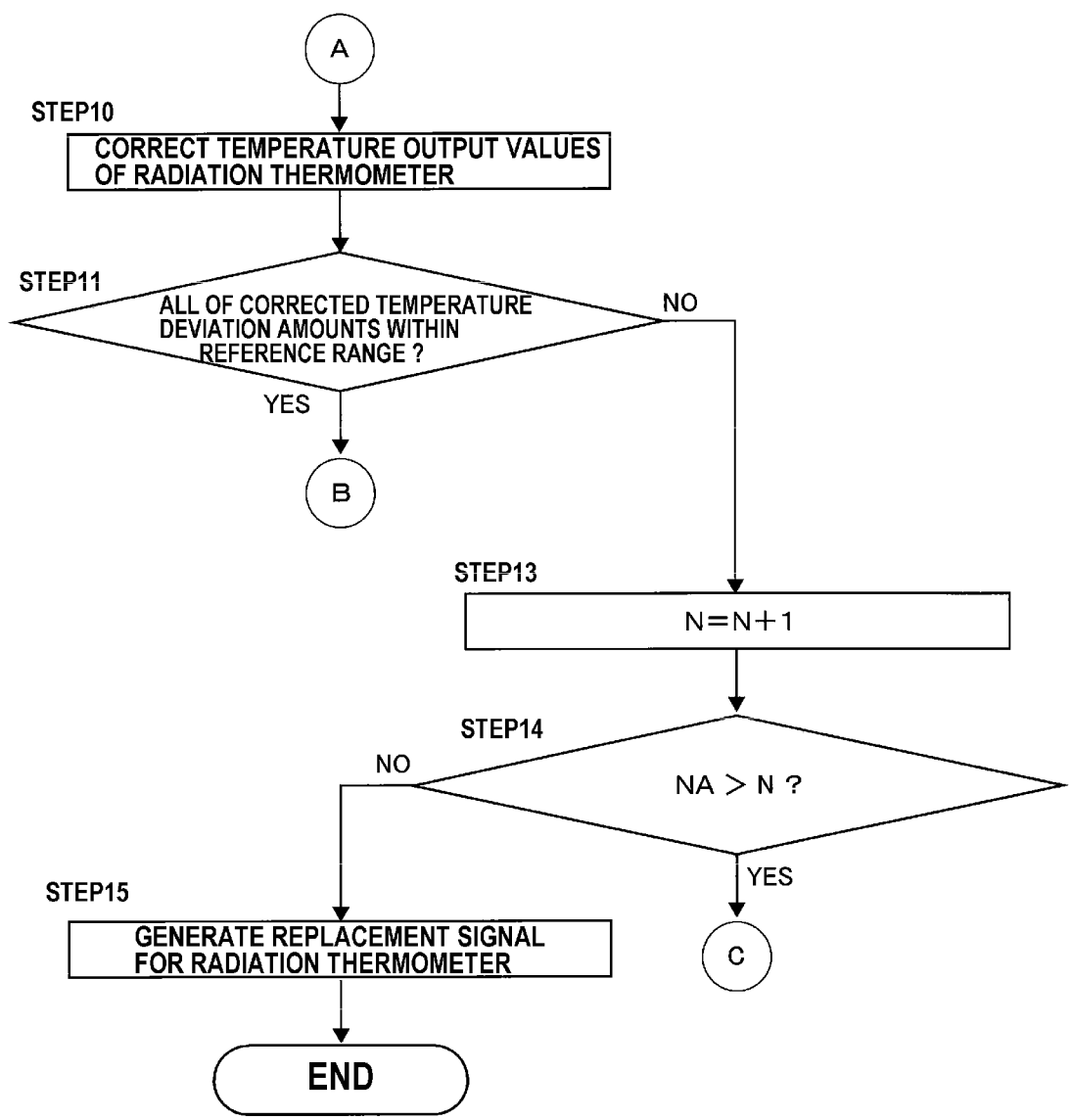
FIG. 8 is a flowchart showing a latter half of the method of calibrating the radiation thermometer according to one embodiment.

FIG. 7 is a flowchart showing a first half of a method of calibrating the second radiation thermometer 48 according to one embodiment, and FIG. 8 is a flowchart showing a latter half of the method of calibrating the second radiation thermometer 48 according to one embodiment. As shown in FIG. 4, first, the calibration tool 60 is placed on the upper surface of the polishing pad 3 so that the measurement body 68 faces the sensor unit 48a of the second radiation thermometer 48 (step 1 in FIG. 7). Further, the temperature regulator 66 of the calibration system is connected to the controller 40 of the polishing apparatus (step 2 in FIG. 7).

The controller 40 stores in advance a plurality of target temperatures set for performing calibration of the second radiation thermometer. The plurality of target temperatures are, for example, constructed of a group of temperatures that are shifted every predetermined temperature interval (e.g, 10° C.), and this group includes, for example, temperatures of 30° C., 40° C., 50° C., 60° C., 70° C., and 80° C. Next, the controller 40 sends one target temperature Ta selected from the plurality of target temperatures to the temperature regulator 66 to heat the heating plate 61a and the measurement body 68 of the heating device 61 to the target temperature Ta (step 3 in FIG. 7). In this embodiment, the controller 40 firstly sends the smallest target temperature (for example, 30° C.) Ta among the plurality of target temperatures to the temperature regulator 66.

When the temperature of the measurement body 68 reaches the target temperature Ta and the measured value of the temperature sensor 61c stabilizes at the target temperature Ta, the second radiation thermometer 48 measures the temperature of the measurement body 68 (step 4 in FIG. 7), and sends the measured value to the controller 40. The controller 40 stores the temperature output value (the measured value of temperature) of the measurement body 68 sent from the second radiation thermometer 48 (step 5 in FIG. 7).

Next, the controller 40 determines whether or not the temperature measurements of the measurement body 68 by the second radiation thermometer 48 have been performed for all the target temperatures (step 6 in FIG. 7). In this embodiment, the controller 40 determines whether or not the target temperature Ta used in step 3 is the highest target temperature (for example, 80° C.) among the plurality of target temperatures. When the target temperature Ta used in step 3 is not the highest target temperature ("No" in step 6 of FIG. 7), the controller 40 selects a target temperature Tb (for example, 40° C.), which is next higher than the target temperature Ta, among the plurality of target temperatures as a next target temperature Ta (step 7 in FIG. 7), and repeats the steps 3 to 5.

When the temperature measurement of the measurement body 68 by the second radiation thermometer 48 is performed for all the target temperatures ("Yes" in step 6 of FIG. 7), the controller 40 calculates a difference between each target temperature Ta and the temperature output value of the second radiation thermometer 48 corresponding to the target temperature Ta, respectively (step 8 in FIG. 7). The difference between the target temperature Ta and the temperature output value of the second radiation thermometer 48 corresponding to the target temperature Ta is an error of the measured value of the second thermometer 48 with respect to the target temperature Ta. In this embodiment, the difference between each target temperature Ta and the temperature output value of the second radiation thermometer 48 corresponding to the target temperature Ta is referred to as "temperature deviation amount". Next, the controller 40 determines whether or not all the temperature deviation amounts are within a reference range (step 9 in FIG. 7). The reference range for the temperature deviation amounts is preset, and stored in the controller 40 in advance.

When there is any temperature deviation amount that exceeds the reference range ("No" in step 9 of FIG. 7), the controller 40 corrects the temperature output values from the second radiation thermometer 48 so that all the temperature deviation amounts are within the reference range (step 10 in FIG. 8). In this embodiment, in order to correct the temperature output values from the second radiation thermometer 48, the controller 40 corrects (i.e, changes) conversion parameters stored in the analog-digital converter 48c of the second radiation thermometer 48.

Figure 9:
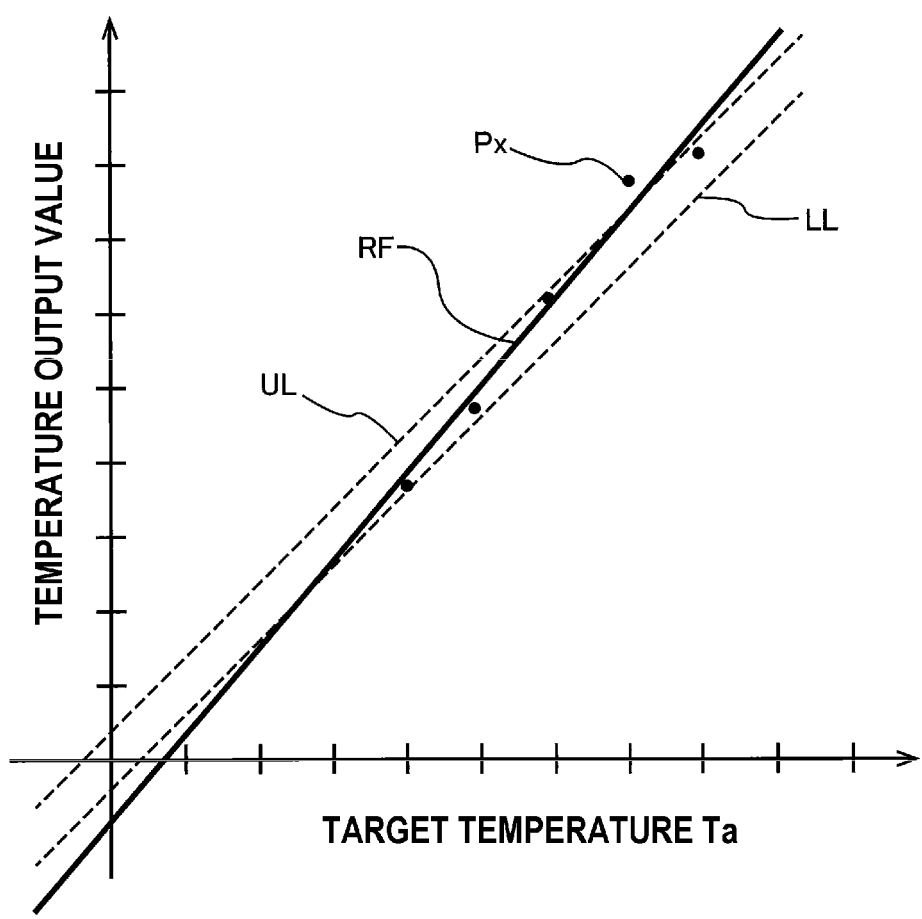
FIG. 9 is a graph illustrating an example of a function that shows a relationship between each target temperature and a temperature output value of the radiation thermometer corresponding to this target temperature.
Figure 10:
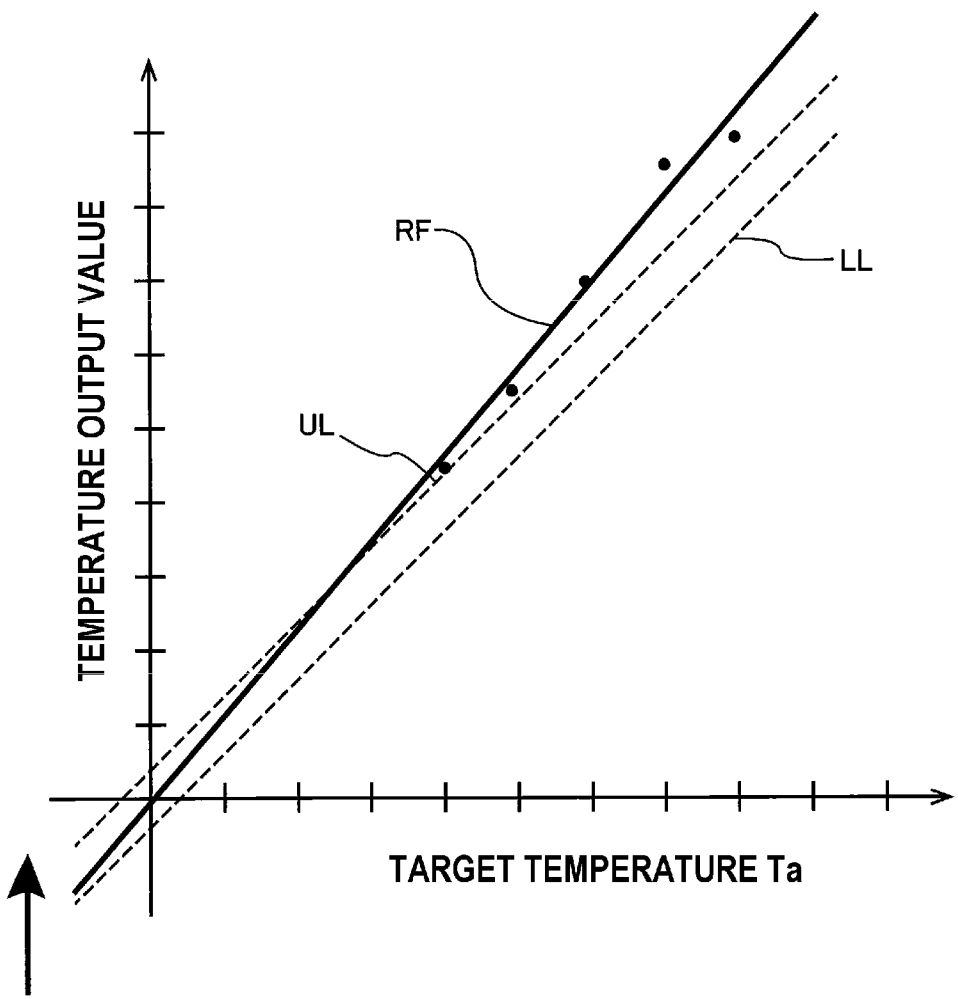
FIG. 10 is a graph illustrating an example in which a y-intercept of the function shown in FIG. 9 has been corrected.
Figure 11:
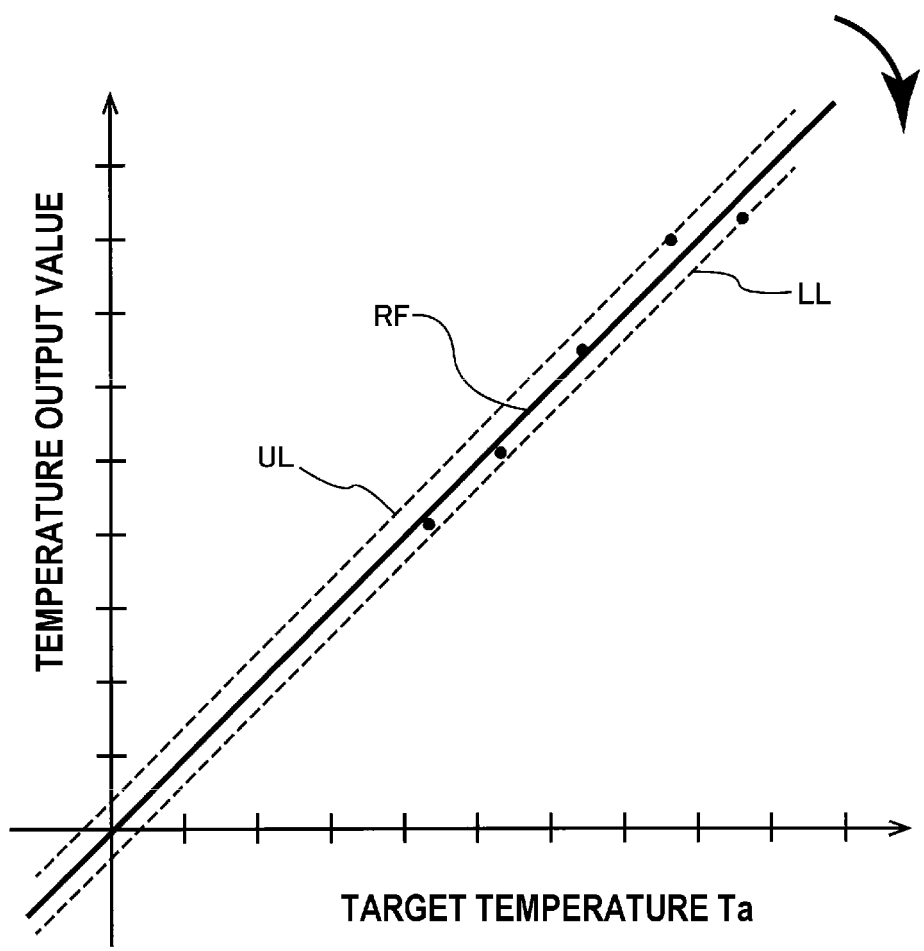
FIG. 11 is a graph illustrating an example in which a slope of the function shown in FIG. 10 has been corrected.

FIGS. 9 through 11 are graphs for illustrating an example of a method of correcting the temperature output values of the second radiation thermometer 48, More specifically, FIG. 9 is a graph illustrating an example of a function that shows a relationship between each target temperature Ta and the temperature output value of the second radiation thermometer 48 corresponding to this target temperature Ta, FIG. 10 is a graph illustrating an example in which a y-intercept of the function shown in FIG. 9 has been corrected, and FIG. 11 is a graph illustrating an example in which a slope of the function shown in FIG. 10 has been corrected. In the graphs shown in FIGS. 9 through 11, a vertical axis (y-axis) represents the temperature output value of the second radiation thermometer 48, and a horizontal axis (x-axis) represents the target temperature Ta. Further, in the graphs shown in FIGS. 9 through 11, an upper limit line UL corresponding to an upper limit, and a lower limit line LL corresponding to a lower limit in the reference range for the temperature deviation amounts are shown by virtual lines (dated lines), respectively.

As described above, the controller 40 stores in advance the plurality of target temperatures Ta to be output to the temperature regulator 66, and the second radiation temperature 48 sends the measured values of temperature of the measurement body 68 heated to each target temperature Ta to the controller 40. Therefore, the controller 40 can plot the temperature output values of the second radiation thermometer 48 corresponding to each target temperature Ta on a graph as shown in FIG. 9. Further, the controller 40 calculates a function RF based on all the plot points. For example, the controller 40 calculates an approximate straight line based on all the plot points by the least square method, and uses this approximate straight line as the function RF.

In the example shown in FIG. 9, a plot point Px exceeds the upper limit line UL. In this case, the controller 40 determines in step 9 shown in FIG. 7 that there is a temperature deviation amount exceeding the reference range, and corrects the slope (i.e, gain) and y-intercept (i.e, offset) of the function RF so that all the temperature deviation amounts are within the reference range.

In this embodiment, the conversion parameters stored in the analog-digital converter 48c of the second radiation thermometer 48 are corrected to thereby change the slope and the y-intercept of the function RF. The v-intercept of the function RF corresponds to the temperature output value of the second radiation thermometer 48 in the function RF when the target temperature Ta is zero. The controller 40 calculates a correction amount in v-intercept based on all the temperature deviation amounts, and moves the function RF up and down along the y-axis based on this correction amount. In the example shown in FIG. 10, the function RF shown in FIG. 9 is moved up along the y-axis so that the y-intercept of the function RF becomes zero. The function RF may be moved down alone the v-axis so that all the temperature deviation amounts are in the reference range. Further, the corrected y-intercept may be different from zero.

Next, the controller 40 calculates a correction amount in slope of the function RF based on all the temperature deviation amounts, and changes the slope of the function RF based on this correction amount. FIG. 11 shows an example of reducing the slope of the function RF which passes through the corrected y-intercept (origin in the graph shown in FIG. 11) so that all the temperature deviation amounts are within the reference range. Of course, the slope of the correlation function RF may be increased so that all the temperature deviation amounts are within the reference ranee.

In one embodiment, the controller 40 may correct the y-intercept of the function RF after correcting the slope of the function RF, or may simultaneously correct the slope and the y-intercept of the function RF. Further, if all the temperature deviation amounts are within the reference range after correcting the v-intercept (or the slope) of the function RF, the controller 40 may omit the correction of the slope (or y-intercept) of the function RF.

As described above, the conversion unit 48e of the second radiation thermometer 48 converts the corrected digital signal value output from the emissivity correction unit 48d into the temperature of the object to be measured. Specifically, the conversion unit 48e stores in advance a conversion formula for converting the corrected digital signal value into the pad surface temperature. In one embodiment, the controller 40 may correct (i.e., change) parameters of the conversion formula stored in the conversion unit 48e in order to correct the slope and y-intercept of the function RF (i.e, to calibrate the second radiation thermometer 48). For example, when the conversion formula is a linear function, a slope and a y-intercept of the conversion formula may be corrected, and when the conversion formula is a quadratic function, coefficients of the conversion formula may be corrected.

In this embodiment, the calibration operation of the second radiation thermometer performed by the controller 40 corresponds to the operation shown in steps 3 through 10 described above. The controller 40 measures the temperature of the measurement body 68 at each target temperature Ta with the second radiation thermometer 48 while changing the temperatures of the heating plate 61a and the measurement body 68 of the heating device 61 to each of the plurality of target temperatures Ta, and calculates the temperature deviation amounts. Further, the controller 40 corrects the conversion parameters stored in the analog-digital converter 48c of the second radiation thermometer 48 (or the parameters of the conversion formula stored in the conversion unit 48e) so that all the temperature deviation amounts are within the reference range.

The controller 40 preferably checks whether or not all the temperature deviation amounts after correction at each target temperature Ta are within the above reference range (step 11 in FIG. 8). Specifically, the controller 40 changes the temperatures of the heating plate 61a and the measurement body 68 of the heating device 61 to each target temperature Ta again, treasures the temperature of the measurement body 68 at each target temperature Ta with the second radiation thermometer 48, calculates the temperature deviation amount at each target temperature Ta, and checks whether or not all the temperature deviation amounts are within the reference range. The operation shown in step 11 is a checking operation for determining whether or not the second radiation thermometer 48 has been reliably calibrated.

Before performing the checking operation, the temperatures of the heating plate 61a and the measurement body 68 of the heating device 61 have been heated by the calibration operation described above to the highest target temperature among the plurality of target temperatures. Accordingly, the controller 40 operates the cooling fan 65 to cool the temperatures of the heating plate 61a and the measurement body 68 in stages to each target temperature Ta from the highest target temperature to the lowest target temperature. In this case, a time required for the checking operation can be reduced, and thus a downtime of the polishing apparatus can be shortened.

In one embodiment, immediately after the calibration operation is completed, the controller 40 may operate the cooling fan 65 to cool the temperatures of the heating plate 61a and the measurement body 68 to room temperature (normal temperature). In this case, the checking operation is performed while heating the temperatures of the heating plate 61a and the measurement body 68 in stages to each target temperature Ta from the lowest target temperature to the highest target temperature.

When all the corrected temperature deviation amounts are within the reference range, the controller 40 generates a signal for indicating that the calibration process of the second radiation thermometer 48 is completed (step 12 in FIG. 7). This completion signal is, for example, used as a trigger for activating a buzzer of the polishing apparatus. By sounding the buzzer of the polishing apparatus, an operator of the polishing apparatus can quickly recognize that the calibration of the second radiation thermometer 48 is completed. In a case also where all the temperature deviation amounts are within the reference range in step 9 of FIG. 7 ("Yes" in step 9 of FIG. 7), the controller 40 determines that it is not necessary to perform the calibration of the second radiation thermometer 48, and generates the completion signal of the calibration process of the second radiation thermometer 48 (step 12 in FIG. 7).

If, in the checking operation shown in step 11, there is any temperature deviation amount that exceeds the reference range ("No" in step 11 of FIG. 8), the controller 40 repeats the calibration operation shown in steps 3 through 10 described above, and the checking operation shown in step 11 described above. Specifically, the controller 40 adds one to the number of repetitions N of the combination of the calibration operation and the checking operation (step 13 in FIG. 8). An initial value of the number of repetitions N is zero, and the controller 40 stores an upper limit NA of the number of repetitions N in advance.

The controller 40 compares the number of repetitions N with the upper limit NA (step 14 in FIG. 8). When the number of repetitions N is smaller than the upper limit NA ("Yes" in step 14 of FIG. 8), the controller 40 returns step 3 to repeat the calibration operation and the checking operation. When the number of repetitions N reaches the upper limit NA ("No" in step 14 of FIG. 8), the controller 40 generates a signal for prompting a replacement of the second radiation thermometer 48 (step 15 in FIG. 8). This replacement signal is, for example, used as a trigger for issuing an alarm for the polishing apparatus. In a case where, even when the calibration operation is repeated until the number of repetitions N reaches the upper limit NA, there is at least one temperature deviation amount that exceeds the reference range in the checking operation, the second radiation thermometer 48 can be considered to be faulty, or to have reached the end of life thereof. Therefore, the controller 40 issues an alarm to thereby prompt the replacement of the second radiation thermometer 48, preventing a polishing abnormality from occurring in the wafer W.

The upper limit NA may be one. In this case, if there is any temperature deviation amount that exceeds the reference range in step 11 of FIG. 8, the controller 40 immediately generates the replacement signal for the second radiation thermometer 48 without repeating the calibration operation and the checking operation.

According to this embodiment, simply by placing the calibration tool 60 of the calibration system below the second radiation thermometer 48 (or the first radiation thermometer 39), and connecting, the temperature regulator 66 to the controller 40 of the polishing apparatus, the controller 40 automatically performs the calibration of the second radiation thermometer 48 (or the first radiation thermometer 39). Therefore, the burden on the operator and the downtime of the polishing apparatus are reduced, so that it can be expected that the calibration processes of the first radiation thermometer 39 and the second radiation thermometer 48 are periodically performed. As a result, the wafer W can be polished at a desired polishing rate, and further, the occurrence of polishing abnormalities on the wafer W can be effectively prevented.

As shown in FIG. 4, the calibration system may have an output device 43, such as a printer. The output device 43 shown in FIG. 4 is provided outside the polishing apparatus, and is configured to wirelessly communicate with the controller 40. In one embodiment, the output device 43 may be configured to connect to the controller 40 by wire. Alternatively, the output device 43 connected to the controller 40 by wire or wirelessly may be provided inside the polishing apparatus.

Figure 12:
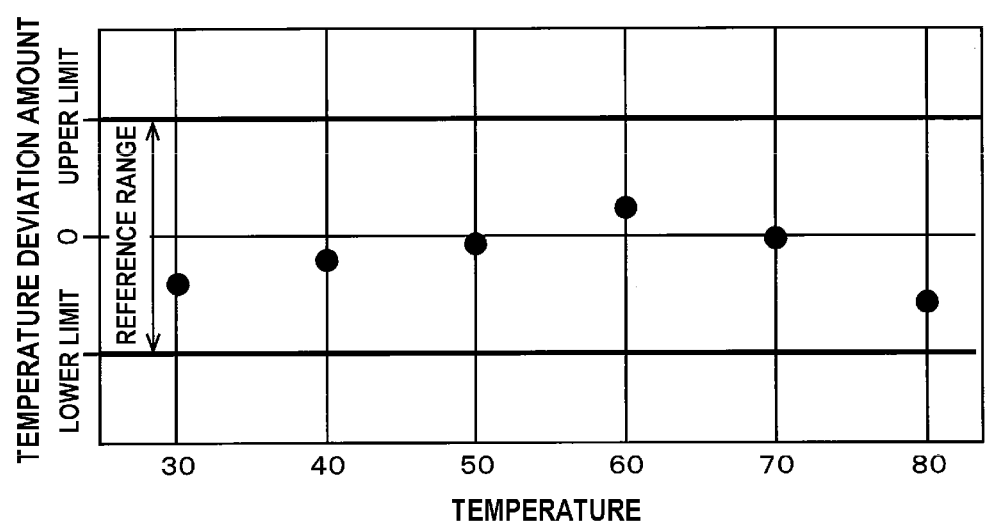
FIG. 12 is a schematic view showing an example of calibration sheet.

The output device 43 reads out the calibration results of the second radiation thermometer 48 (or the first radiation thermometer 39) from the controller 40, and outputs a calibration sheet as shown in FIG. 12. On the calibration sheet, at least the date when the radiation thermometer was calibrated, the slope (i.e, gain) and y-intercept (i.e, offset) of the function RF before and after the correction, and the temperature deviation amounts of the radiation thermometer obtained during the checking operation (see step 11 in FIG. 8) are preferably indicated. Storing such calibration sheets enables the life (that is, replacement time) of each of the radiation thermometer 39, 48 to be estimated.

Figure 13:
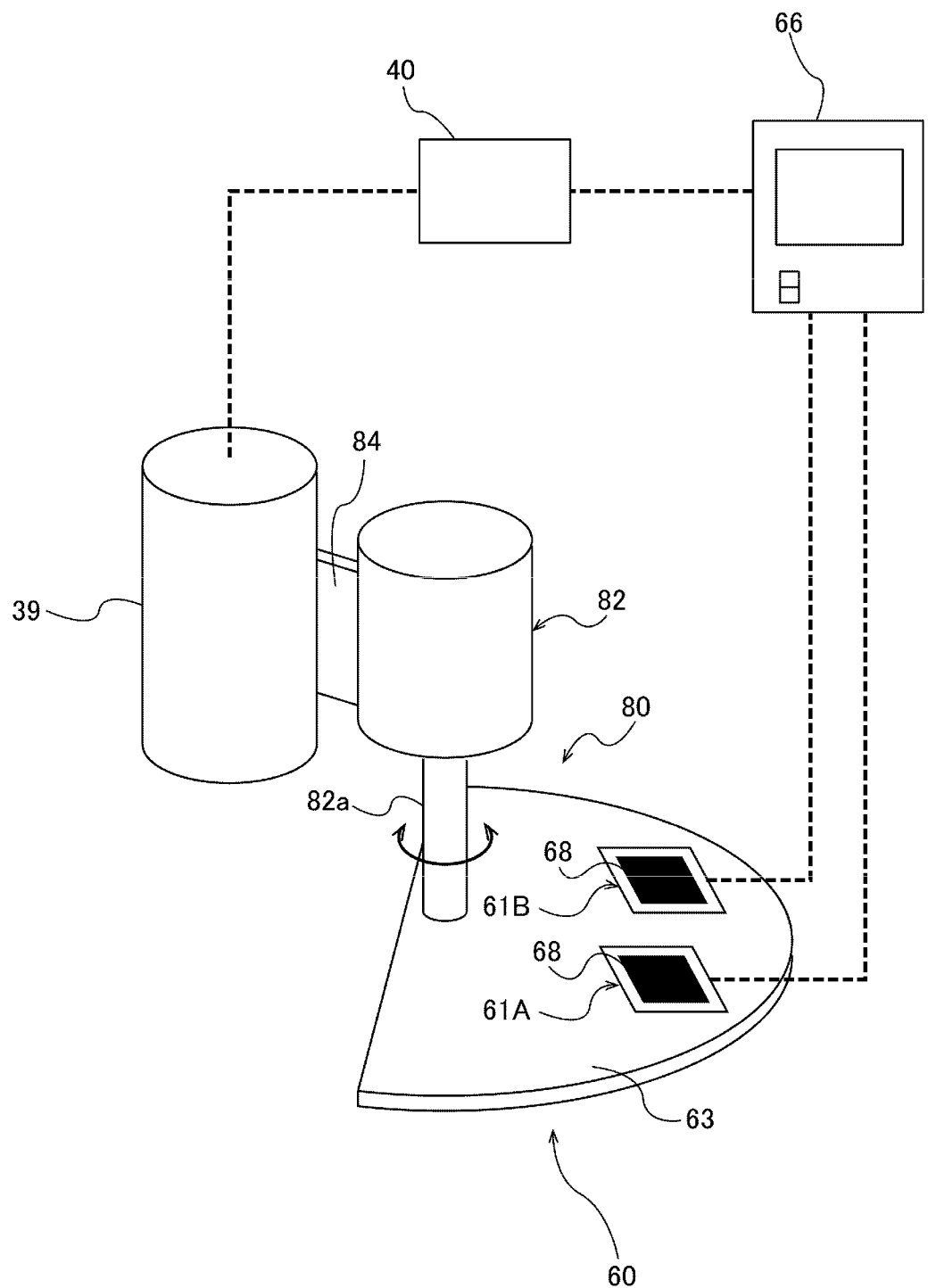
FIG. 13 is a perspective view schematically showing the calibration tool according to another embodiment.

FIG. 13 is a perspective view schematically showing the calibration tool of the calibration system according to another embodiment. Configuration of this embodiment, which is not specifically described, is the same as the configuration of the above-described embodiments, and thus duplicate descriptions thereof are omitted.

The radiation thermometers 39, 48 may become dirty due to an adhesion of the polishing liquid or the like to the radiation thermometers 39, 48. Further, the radiation thermometers 39, 48 may be failed. In these cases, since the radiation thermometers 39, 48 cannot accurately measure the pad surface temperature, there is a risk that polishing abnormalities may occur in the wafer W, or a yield may be decreased. Therefore, it is desirable to check whether or not the radiation thermometers 39, 48 are accurately measuring the pad surface temperature every time a predetermined number of wafers W are polished (for example, every time one wafer W is polished). For this purpose, in this embodiment, the calibration tool 60 is placed in the vicinity of the radiation thermometers to check the temperature output values of the radiation thermometers 39, 48 each time the predetermined number of wafers W are polished.

FIG. 13 illustrates a calibration tool 60 disposed in the vicinity of the first radiation thermometer 39. Although not shown, a calibration tool having the same configuration as the calibration tool 60 shown in FIG. 13 is also disposed in the vicinity of the second radiation thermometer 48. In one embodiment, the calibration tool 60 shown in FIG. 13 may be placed in the vicinity of either one of the first radiation thermometer 39 and the second radiation thermometer 48.

The calibration tool 60 shown in FIG. 13 includes a plurality of heating devices 61A, 61B (two heating devices in the illustrated example), the temperature regulator 66 connected to the heating devices 61A, 61B, and a moving mechanism (heating-device moving mechanism) 80 for moving each of the heating devices 61A, 61B below the first radiation thermometer 39. In this embodiment, each of the heating devices 61A and 61B has the same configuration as the heating device 61 described with reference to FIGS. 4 to 6. Accordingly, each of the heating devices 61A, 61B has the measurement body 68 (see FIGS. 5A and 5B) described above. In one embodiment, each of the heating devices 61A, 61B may have a Peltier element as a heating source for the heating plate 61a and the measurement body 68, instead of a heater 61b.

In this embodiment, although the heating devices 61A, 61B are connected to the common temperature regulator 66, individual temperature regulators 66 corresponding to each of the plurality of heating devices 61A, 61B may be provided. The controller 40 heats each of the plurality of heating devices 61A, 61B to the predetermined target temperatures through the temperature regulator 66. The predetermined target temperatures set with respect to the heating devices 61A, 61B may be the same or different from each other. The controller 40 stores the predetermined target temperatures of the heating devices 61A, 61B in advance.

The moving mechanism 80 shown in FIG. 13 has the platform 63 for supporting the heating devices 61A, 61B, and an actuator 82 for rotating the platform 63. In this embodiment, the platform 63 is a plate member having a semicircular shape, and the actuator 82 is a motor. The moving mechanism 80 further has a support arm 84 for supporting the actuator 82, and the support arm 84 is secured to the first radiation thermometer 39. The support arm 84 can be secured to any stationary member as long as it is capable of supporting the movement mechanism 80. For example, the support arm 84 may be secured to a frame structure (not shown) of the polishing apparatus. Further, a rotation axis 82a of the actuator 82 is coupled to the platform 63. When the actuator 82 is set in motion, the platform 63 rotates around the rotation axis 82a. The actuator 82 is configured to allow the platform 63 to rotate at any desired rotation angle.

Figure 14:
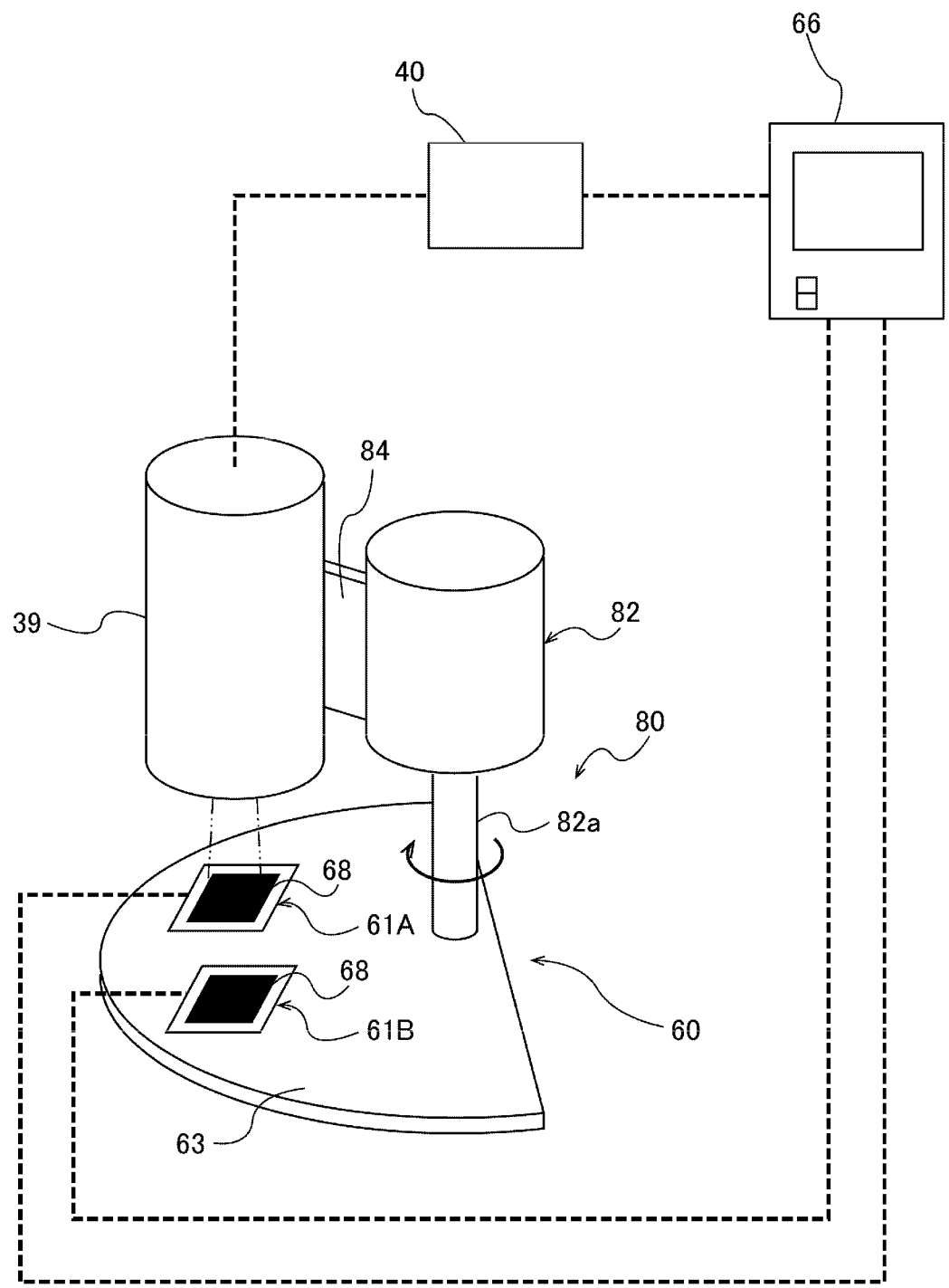
FIG. 14 is a schematic view showing a state in which a heating device is moved below the radiation thermometer by a heating-device moving mechanism shown in FIG. 13.

FIG. 14 is a schematic view showing a state in which one heating device 61A is moved below the first radiation thermometer 39. FIG. 14 illustrates a first measurement position where the platform 63 has been moved so that one heating device 61A is positioned below the first radiation thermometer 39. Although not shown, a position of the platform 63 when the other heating device 61B is positioned below the first radiation thermometer 39 is referred to as a second measurement position. FIG. 13 illustrates a standby position where the platform 63 is moved away from the first radiation thermometer 39. When the platform 63 is moved to the standby position, the first radiation thermometer 39 can measure the surface temperature of the polishing pad 3.

When checking the temperature output values of the first radiation thermometer 39, the controller 40 operates the actuator 82 to move the platform 63 from the standby position to each of the first and second measurement positions. The controller 40 further obtains from the first radiation thermometer the temperature output values of the measurement bodies 68 of the heating devices 61A and 61B, which are heated to the predetermined target temperatures, respectively. The distance from the first radiation thermometer 39 to the heating devices 61A, 61B is preferably as small as possible so as to avoid large errors in the temperature output values of the first radiation thermometer 39 due to disturbances. For example, the distance between the first radiation thermometer 39 and the heating devices 61A, 61B is set so that the surface area of the measurement body 68 is less than 1.5 times a field of view of the first radiation thermometer 39.

As described above, the type of the temperature sensor 61c is free-selected. For example, the temperature sensor 61c may be a thermocouple, a platinum resistance thermometer, a thermistor thermometer, a bimetal thermometer, or IC temperature sensor. Since the platinum resistance thermometer has high measurement accuracy, it is preferable that the temperature sensor 61c is the platinum resistance thermometer.

Figure 15:
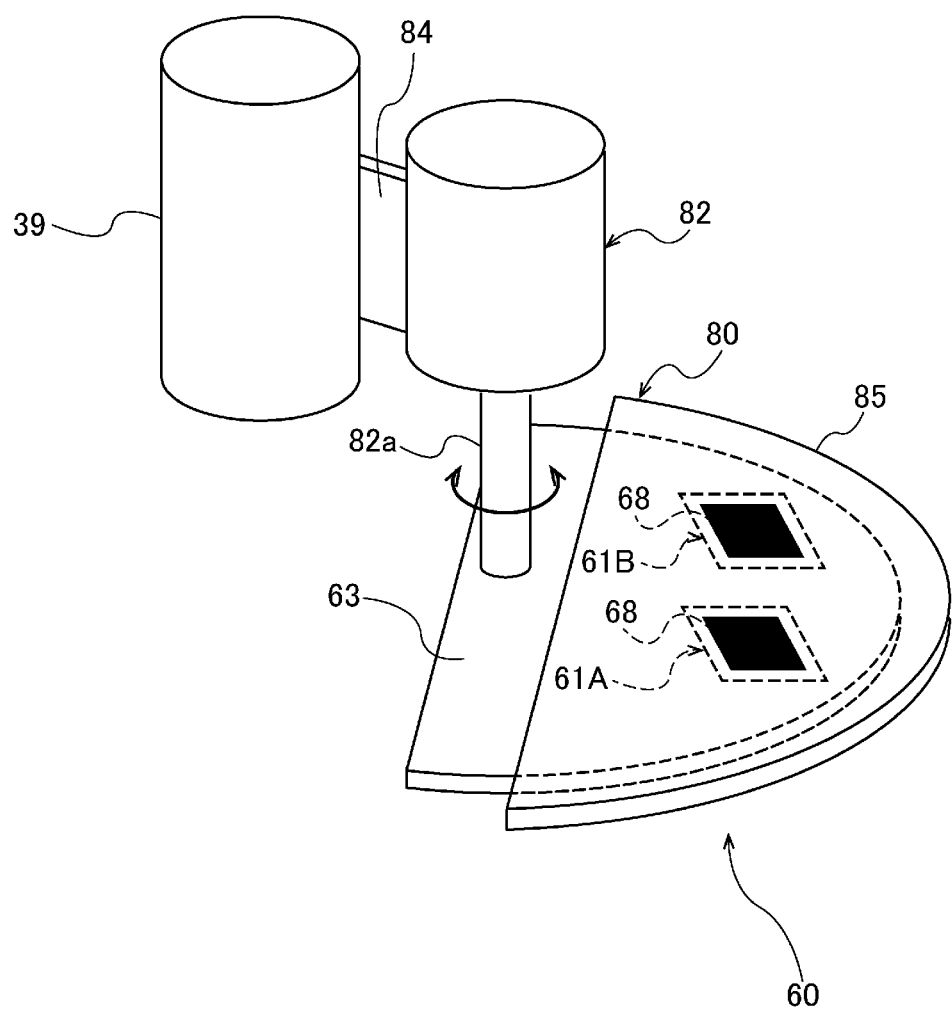
FIG. 15 is a schematic view showing a protective cover for the heating device.

FIG. 15 is a schematic view showing a protective cover for the heating devices 61A and 61B. If dirt (e.g, polishing liquid) adheres to the measurement bodies 68 of the heating devices 61A, 61B, the first radiation thermometer 39 cannot measure the accurate temperatures of the measurement bodies 68. Therefore, the protective cover 85 may be provided, which covers the heating devices 61A, 61B that have been moved to the standby position. The protective cover 85 shown in FIG. 15 has an approximate semicircular shape, and has a housing space formed therein, which provides accommodation for the heating devices 61A, 61B together with a part of the platform 63. The protective cover 85 is secured to a stationary member, such as a frame structure of the polishing apparatus, through a secure member (not shown), such as a bracket.

Next, a method of checking the temperature output values of the first radiation thermometer 39 will be described. A method of checking the temperature output values of the second radiation thermometer 48 is the same as the method of checking the temperature output values of the first radiation thermometer 39, and thus duplicate descriptions thereof are omitted. As described below, if the temperature output values of the radiation thermometers 39, 48 deviate from the allowable range set for the predetermined target temperature, the radiation thermometers 39, 48 are calibrated.

Figure 16:
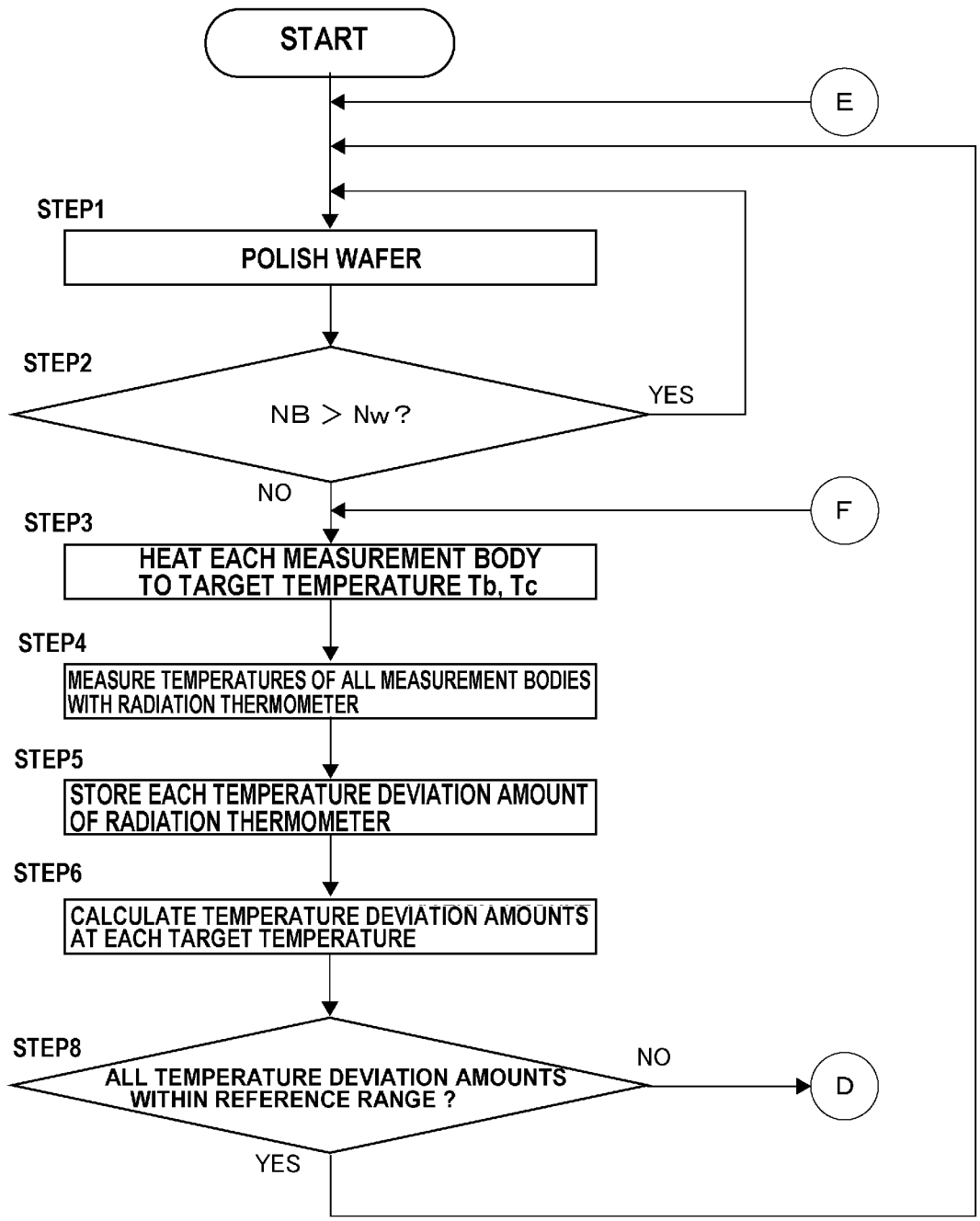
FIG. 16 is a flowchart showing a first half of a method for checking the temperature output values of the radiation thermometer according to one embodiment.
Figure 17:
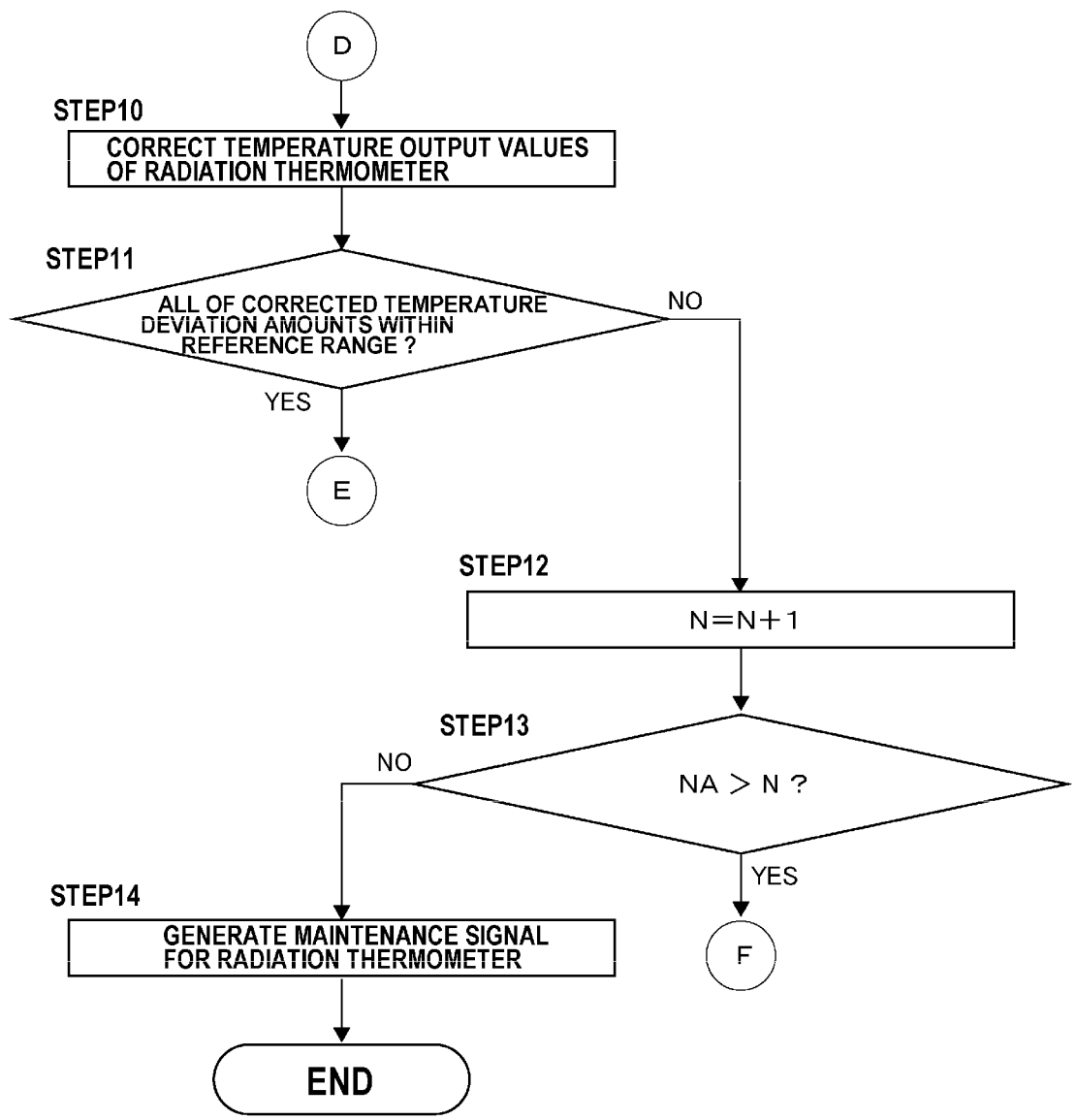
FIG. 17 is a flowchart showing a latter half of the method for checking the temperature output values of the radiation thermometer according to one embodiment.

FIG. 16 is a flowchart showing a first half of the method for checking the temperature output values of the first radiation thermometer 39 according to one embodiment, and FIG. 17 is a flowchart showing a latter half of the method for checking the temperature output values of the first radiation thermometer 39 according to one embodiment.

As shown in FIG. 16, the controller 40 performs the polishing process of the wafer W (step 1 in FIG. 16). Next, the controller 40 determines whether or not the number of wafers Nw to be polished reaches a predetermined number of wafers NB (step 2 in FIG. 16). The controller 40 stores the predetermined number of wafers NB in advance. The predetermined number of wafers NB may be "one". If the number of wafers Nw to be polished has not reached the predetermined number of wafers NB (see "Yes" in step 2 of FIG. 16), the controller 40 returns to step 1 to perform the polishing process for the next wafer W.

The controller 40 stores in advance a plurality of target temperatures Tb, Tc set for each measurement body 68 of the plurality of heating devices 61A, 61B in order to check the temperature output values of the first radiation thermometer 39. These target temperatures Tb and Tc may be the same as each other or may be different from each other. When the number of wafers NW to be polished reaches a predetermined number of wafers NB (see "No" in step 2 of FIG. 16), the controller 40 heats the measurement bodies 68 of the heating devices 61A and 61B to the target temperatures Tb and Tc, respectively, through the temperature regulator 66 (step 3 of FIG. 16).

Next, the first radiation thermometer 39 measures the temperature of each measurement body 68 (step 4 in FIG. 16), and sends those measured values to the controller 40. Further, the controller 40 stores the temperature output values (temperature measurement values) of each measurement body 68 sent from the first radiation thermometer 39 (step 5 in FIG. 16).

Next, the controller 40 calculates differences between the target temperatures Tb, Tc and the temperature output values of the first radiation thermometer 39 corresponding to each target temperatures Tb, Tc, respectively (step 6 in FIG. 16). In other words, the controller 40 calculates "temperature deviation amounts", which are the differences between each of the target temperatures Tb, Tc and the temperature output values of the first radiation thermometer 39 corresponding to the target temperatures Tb and Tc, respectively. Next, the controller 40 determines whether or not all the temperature deviation amounts are within the reference range (step 8 in FIG. 16), The reference range for the temperature deviation amounts is preset, and stored in the controller 40 in advance.

If there is any temperature deviation amount that exceeds the reference range ("No" in step 8 of FIG. 16), the controller 40 corrects the temperature output values from the first radiation thermometer 39 so that all the temperature deviation amounts are within the reference range (step 10 of FIG. 17). In this embodiment also, the controller 40 corrects (i.e., changes) the conversion parameters stored in the analog-digital converter 48c of the first radiation thermometer 39 in order to correct the temperature output values from the first radiation thermometer 39. For example, the controller 40 corrects, using the method described with reference to FIGS. 9 through 11 the slope (i.e, gain) and the y-intercept (i.e, offset) of the function RF so that all temperature deviation amounts are within the reference range. Alternatively, the correction of the temperature output values may be performed by the correction of the parameters of the conversion formula stored in the conversion unit 48e of the first radiation thermometer 39.

In this manner, if any temperature output value of the first radiation thermometer 39 exceeds the allowable range when the measurement bodies 68 of the plurality of heating devices 61A, 61B are measured with the first radiation thermometer 39, the calibration of the first radiation thermometer 39 is performed. As a result, the wafer W can be polished at a desired polishing rate, and further, the occurrence of polishing abnormalities on the wafer W can be effectively prevented.

In this embodiment also, the controller 40 preferably checks whether all the temperature deviation amounts after the correction are within the reference range (step 11 in FIG. 17). Specifically, the controller 40 again measures the temperatures of the measurement bodies 68 of the heating devices 61A and 61B, which are maintained at the predetermined target temperatures Tb, Tc, respectively, with the first radiation thermometer 39, calculates the temperature deviation amounts with respect to the target temperatures Tb, Tc, respectively, and checks whether all the temperature deviation amounts are within the reference range. The operation shown in step 11 is a checking operation for determining whether or not the first radiation thermometer 39 has been reliably calibrated.

If all the corrected temperature deviation amounts are within the reference ranee, the controller 40 returns to step 1 to perform the polishing process for the next wafer W.

In a case also where all the temperature deviation amounts are within the reference ranee in step 8 of FIG. 16, the controller 40 performs the polishing process for the next wafer W without performing the calibration of the first radiation thermometer 39.

If, in the checking operation shown in step 11, there is any temperature deviation amount that exceeds the reference range ("No" in step 11 of FIG. 17), the controller 40 repeats the calibration operation shown in steps 3 through 10 and the checking operation shown in step 11. Specifically, the controller 40 adds one to the number of repetitions N of the combination of the calibration operation and the checking operation (step 13 in FIG. 17). The initial value of the number of repetitions N is zero, and the controller 40 stores the upper limit NA of the number of repetitions N in advance.

The controller 40 compares the number of repetitions N with the upper limit NA (step 13 in FIG. 17). When the number of repetitions N is smaller than the upper limit NA ("Yes" in step 14 of FIG. 8), the controller 40 returns step 3 of FIG. 16 to repeat the calibration operation and the checking operation. When the number of repetitions N reaches the upper limit NA ("No" in step 13 of FIG. 17), the controller 40 generates a signal for prompting a maintenance of the first radiation thermometer 48 (step 14 in FIG. 17). This maintenance signal is, for example, used as a trigger for issuing an alarm for the polishing apparatus. In a case where, even when the calibration operation is repeated until the number of repetitions N reaches the upper limit NA, there is at least one temperature deviation amount that exceeds the reference range in the checking operation, it can be considered that dirt is attached to the first radiation thermometer 39, or that the first radiation thermometer 39 is faulty. Therefore, the controller 40 issues an alarm to thereby prompt the maintenance of the first radiation thermometer 39, preventing polishing abnormality from occurring in the wafer W.

The upper limit NA may be one. In this case, if there is any temperature deviation amount that exceeds the reference range in step 11 of FIG. 17, the controller 40 immediately generates the maintenance signal for the first radiation thermometer 39 without repeating the calibration operation and the checking operation.

Figure 18A:
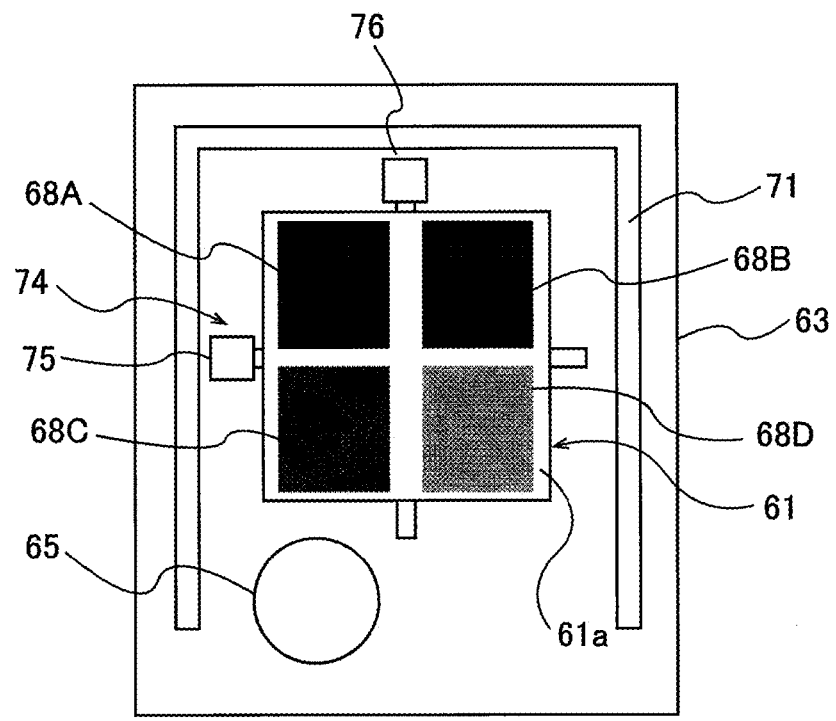
FIG. 18A is a top view schematically showing the calibration tool according to still another embodiment.
Figure 18B:
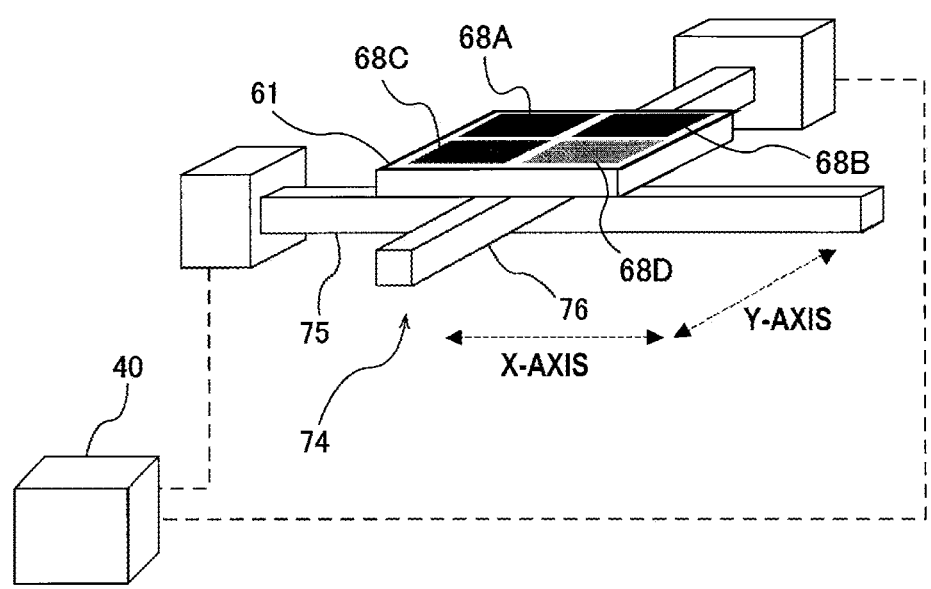
FIG. 18B is a perspective view schematically showing a moving mechanism for moving a heating plate shown in FIG. 18A.

FIG. 18A is a top view schematically showing the calibration tool 60 of a calibration system according to still another embodiment, and FIG. 18B is a perspective view schematically showing a moving mechanism for moving the heating plate 61a shown in FIG. 18A. Configuration of this embodiment, which is not specifically described, is the same as the configuration of the above-described calibration systems, and thus duplicate descriptions thereof are omitted.

As shown in FIG. 18A, a plurality of measurement bodies (four measurement bodies in the illustrated example) 68A, 68B, 68C, 68D are attached to an upper surface of the heating plate 61a of the heating device 61. The plurality of measurement bodies 68A through 68D have different emissivities from each other, and the emissivity of one measurement body (e.g, measurement body 68A) selected from the plurality of measurement bodies 68A through 68D is input to the emissivity correction unit 48d (see FIG. 6) of the second radiation thermometer 48. The emissivities of each measurement bodies 68A through 68D are known, and stored in advance in the controller 40.

Further, the calibration tool 60 has a moving mechanism (measurement-body moving mechanism) 74 for moving the heating plate 61a in a horizontal direction with respect to the platform 63. In this embodiment, the moving mechanism 74 is constructed of a combination of an X-axis moving mechanism 75 and a Y-axis moving mechanism 76 that move the heating plate 61a horizontally. The X-axis moving mechanism 75 is configured to move the heating plate 61a along the X-axis, and the Y-axis moving mechanism 76 is configured to move the heating plate 61a along the Y-axis perpendicular to the X-axis. Each of these X-axis movement mechanism 75 and Y-axis movement mechanism 76 is, for example, constituted by a ball screw mechanism and a servomotor for driving the ball screw mechanism. In one embodiment, each of the X-axis movement mechanism 75 and the Y-axis movement mechanism 76 may be a piston-cylinder mechanism. The X-axis movement mechanism 75 and the Y-axis movement mechanism 76 are connected to the controller 40, and the controller 40 can control operations of the X-axis movement mechanism 75 and the Y-axis movement mechanism 76, i.e, an operation of the movement mechanism 74.

The controller 40 can operate the X-axis moving mechanism 75 and the Y-axis moving mechanism 76 to thereby move the heating plate 61a in the X-axis and Y-axis directions relative to the second radiation thermometer 48 (or the first radiation thermometer 39). Thus, the controller 40 can control the operation of the moving mechanism 74 to thereby position each of the plurality of measurement bodies 68A through 68D attached to the upper surface of the heating plate 61A directly under the second radiation thermometer 48 (or the first radiation thermometer 39).

In this embodiment, the temperature of each of the plurality of measurement bodies 68A through 68D heated to a predetermined target temperature is measured by the second radiation thermometer 48 (or the first radiation thermometer 39). As described above, the emissivity of one measurement body 68A selected from the plurality of measurement bodies 68A through 68D is input to the emissivity correction section 48d of the second radiation thermometer 48. In this case, since the emissivities of the measurement bodies 68B through 68D is different from the emissivity input to the emissivity correction section 48d of the second radiation thermometer 48, each of the temperature output values of the measurement bodies 68B through 68D output from the second radiation thermometer 48 includes a measurement error caused by the setting error of emissivity. This measurement error will be described below with reference to FIGS. 19A through 19D.

Figure 19A:
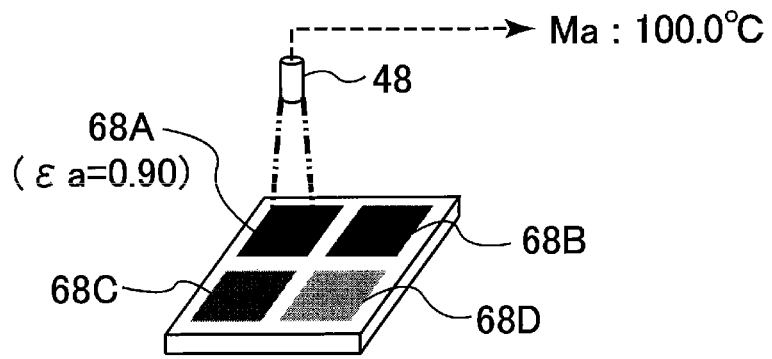
FIG. 19A is a schematic view illustrating a measurement error of a temperature output value output from the radiation thermometer when temperatures of a plurality of measurement bodies heated to a target temperature of 100° C. is measured by the radiation thermometer, respectively.
Figure 19B:
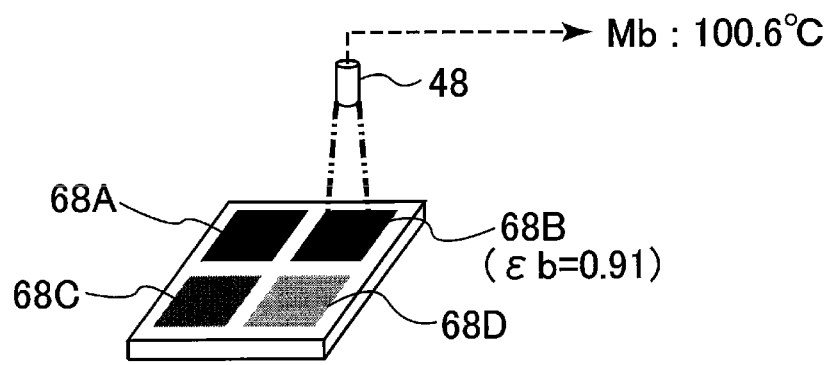
FIG. 19B is a schematic view illustrating a measurement error of a temperature output value output from the radiation thermometer when temperatures of a plurality of measurement bodies heated to a target temperature of 100° C. is measured by the radiation thermometer, respectively.
Figure 19C:
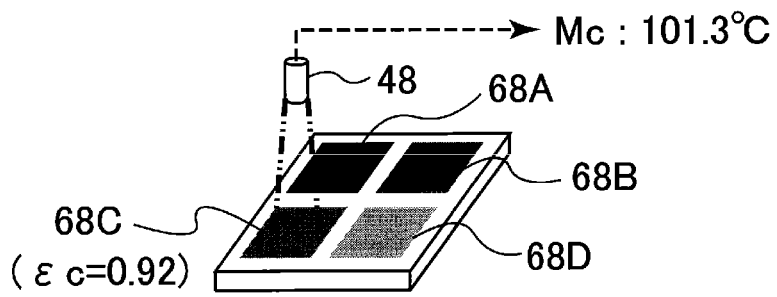
FIG. 19C is a schematic view illustrating a measurement error of a temperature output value output from the radiation thermometer when temperatures of a plurality of measurement bodies heated to a target temperature of 100° C. is measured by the radiation thermometer, respectively.
Figure 19D:
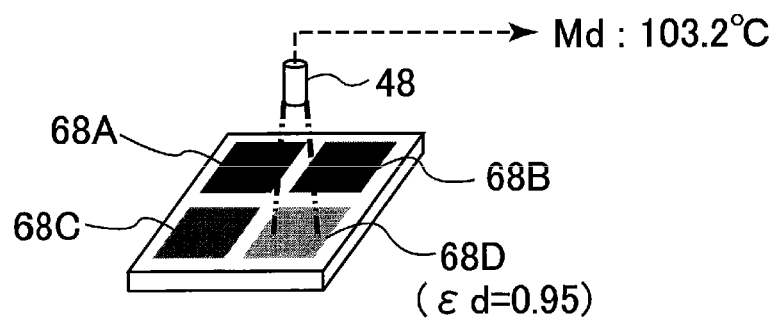
FIG. 19D is a schematic view illustrating a measurement error of a temperature output value output from the radiation thermometer when temperatures of a plurality of measurement bodies heated to a target temperature of 100° C. is measured by the radiation thermometer, respectively.

FIGS. 19A through 19D are schematic views each of which illustrates a measurement error of a temperature output value output from the second radiation thermometer when temperatures of a plurality of measurement bodies 68A through 68D heated to a target temperature of 100° C. is measured by the second radiation thermometer 48, respectively. More specifically, FIG. 19A is a schematic view showing a temperature output value Ma to be output from the second radiation thermometer 48 when the temperature of the measurement body 68A heated to 100° C. and having an emissivity εa of 0.90 is measured by the second radiation thermometer 48, and FIG. 19B is a schematic view showing a temperature output value Mb to be output from the second radiation thermometer 48 when the temperature of the measurement body 68B heated to 100° C. and having an emissivity εb of 0.91 is measured by the second radiation thermometer 48. FIG. 19C is a schematic view showing the temperature output value Mc to be output from the second radiation thermometer 48 when the temperature of the measurement body 68C heated to 100° C. and having an emissivity εc of 0.92 is measured by the second radiation thermometer 48, and FIG. 19D is a schematic view showing the temperature output value Md to be output from the second radiation thermometer 48 when the temperature of the measurement body 68D heated to 100° C. and having an emissivity ad of 0.95 is measured by the second radiation thermometer 48.

Typically, if an emissivity pre-input to the radiation thermometer differs from an emissivity of an object to be measured, the temperature output value (temperature measurement value) output from the radiation thermometer includes a measurement error caused by the emissivity setting error. The emissivity setting error is a ratio of the emissivity input to the radiation thermometer relative to the emissivity of the object to be measured, and is expressed by the following equation (1).

$$E(\%) = (\varepsilon 0/\varepsilon - 1,00) \cdot 100 \qquad (1)$$

where E represents the setting error of emissivity, ε0 represents the emissivity input to the radiation thermometer, and ε represents the emissivity of the object to be measured.

In this embodiment, the emissivity input to the second radiation thermometer 48 is 0.90, corresponding to the emissivity εa of the measurement body 68A. Accordingly, when measuring the measurement body 68A with the second radiation thermometer 48, the emissivity setting error is 0%, and thus the temperature output value output from the second radiation thermometer 48 does not include the measurement error. In contrast, the emissivities εb-εd of the measurement bodies 68B through 68D are different from the emissivity εa of the measurement body 68A, respectively. Therefore, when measuring each of the measurement bodies 68B through 68D with the second radiation thermometer 48, each temperature output value output from the second radiation thermometer 48 includes a measurement error caused by the emissivity setting error. Specifically, when measuring the measurement body 68B having the emissivity εb of 0.91, the emissivity setting error is 1%, and thus the temperature output value output from the second radiation thermometer 48 includes the measurement error caused by the emissivity setting error of 1%, Similarly, when measuring the measurement body 68C having the emissivity εc of 0.92, the temperature output value output from the second radiation thermometer 48 includes the measurement error caused by the emissivity setting error of 2%, and when measuring the measurement body 68D having the emissivity εd of 0.95, the temperature output value output from the second radiation thermometer 48 includes the measurement error caused by the emissivity setting error of 5%.

The relationship between the intensity (amount of energy) of the electromagnetic wave emitted from the object to be measured and the temperature of the object to be measured is not a linear relationship. Therefore, even though the emissivity setting error is multiplied by the temperature measurement value output from the radiation thermometer, the measurement error cannot be corrected. For example, when the emissivity setting error is 5%, multiplying the temperature measurement value output from the radiation thermometer by 1.05 does not obtain the actual temperature of the object to be measured. Further, the measurement error caused by the emissivity setting error depends on a wavelength of the electromagnetic wave used by the radiation thermometer and the temperature of the object to be measured.

However, if the emissivities of the plurality of measurement bodies 68A to 68D are known, each of the measurement errors occurring when the temperatures of the measurement bodies 68A to 68D heated to the predetermined target temperature Tx are measured h the second radiation thermometer can be obtained previously by experiments. In other words, expected values Ma-Md of the temperature output values to be output from the second radiation thermometer 48 when the measurement bodies 68A to 68D are measured by the second radiation thermometer 48, respectively, can be obtained previously. In this specification, each of the expected values Ma-Md of the temperature output values to be output from the second radiation thermometer 48 is referred to as a "temperature expectation value."

For example, the target temperature Tx used for calibration of the second radiation thermometer 48 has been previously determined as 100° C. In this case, an experiment is performed, in which the temperatures of the measurement bodies 68B through 68D heated to 100° C. are actually measured with the second radiation thermometer 48 in which the emissivity Ea of the measurement body 68A is input. Then, the temperature output values of the measurement bodies 68B through 68D output from the second radiation thermometer 48 are determined as the temperature expectation values Mb-Md, respectively. When measuring the measurement body 68A with the second radiation thermometer 48, the emissivity setting error is 0%, and thus the temperature measurement value does not include the measurement error. Therefore, the temperature expectation value Ma of the measurement body 68A to be output from the second radiation thermometer 48 is equal to the target temperature Tx (=100° C.). Examples of the temperature expectation values Ma-Md determined by such experiment are illustrated in FIGS. 19B through 19D.

In one embodiment, a characteristic equation, which represents a relationship between the emissivity setting error at the predetermined target temperature Tx and the measurement error, may be determined in advance based on the temperature output values of each of the measurement bodies 68A through 68D output from the second radiation thermometer 48. In this case, the temperature expectation values Ma through Md are determined from the characteristic equation.

In this manner, in a case where the calibration of the second radiation thermometer 48 is performed using the calibration tool 60 according to this embodiment, it is necessary to determine in advance the temperature expectation values Ma-Md which are output from the second temperature radiometer 48 when each of the plurality of measurement bodies 68A through 68D heated to the predetermined target temperature Tx is measured by the second temperature radiometer 48. The same applies a case where the calibration of the first radiation thermometer 39 is performed using the calibration tool 60 according to this embodiment. The temperature expectation values Ma Md are stored in advance in the controller 40.

Next, referring to FIGS. 20 and 21, a method of calibrating the second radiation thermometer 48 using the calibration tool 60 shown in FIG. 18A will be described. A method of calibrating the first radiation thermometer 39 using the calibration tool 60 shown in FIG. 18A is the same as the method of calibrating the second radiation thermometer 48 described below, and thus duplicate descriptions thereof are omitted.

Figure 20:
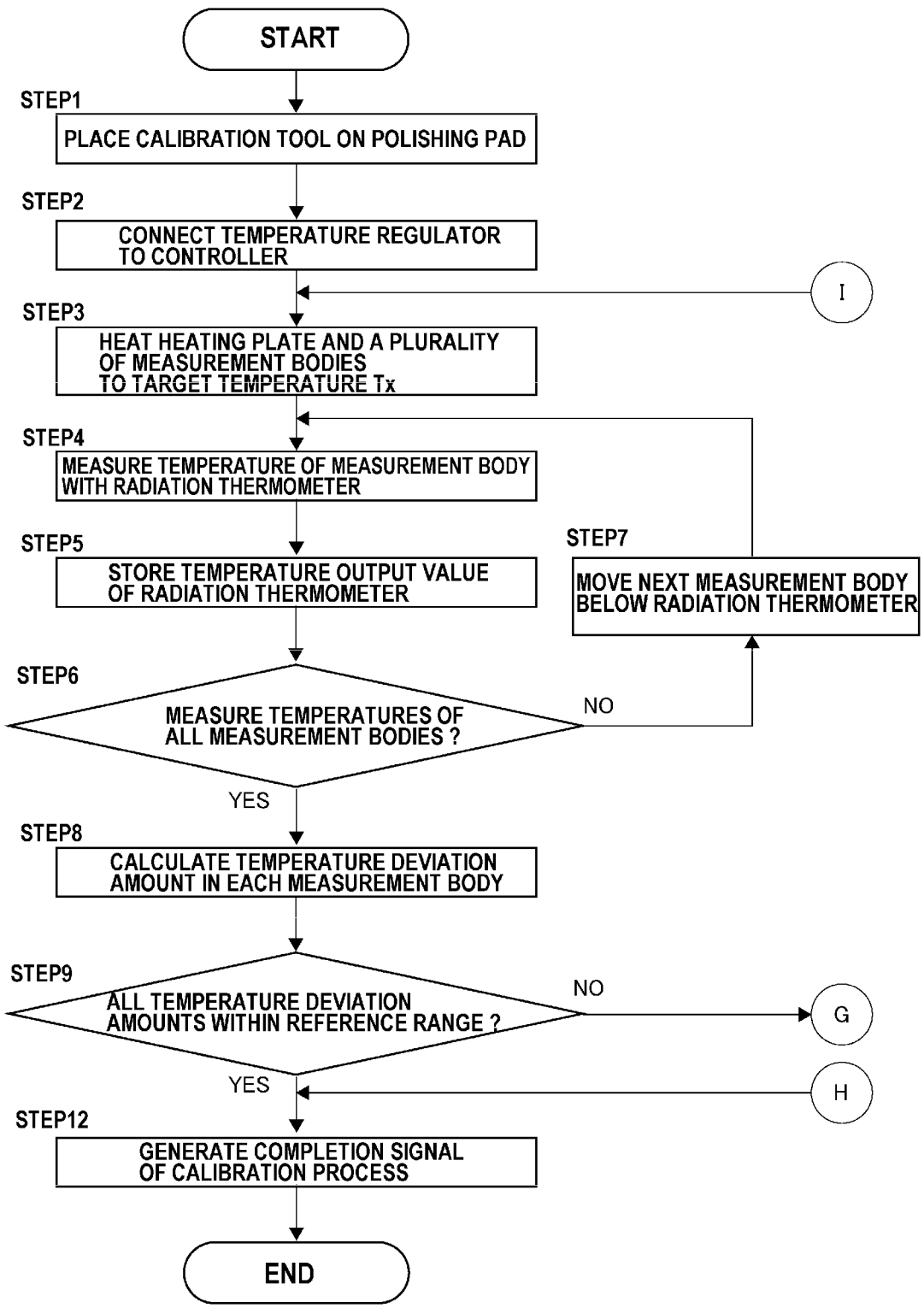
FIG. 20 is a flowchart showing a first half of a method of performing the calibration of the radiation thermometer in a calibration system with the calibration tool shown in FIG. 18A.
Figure 21:
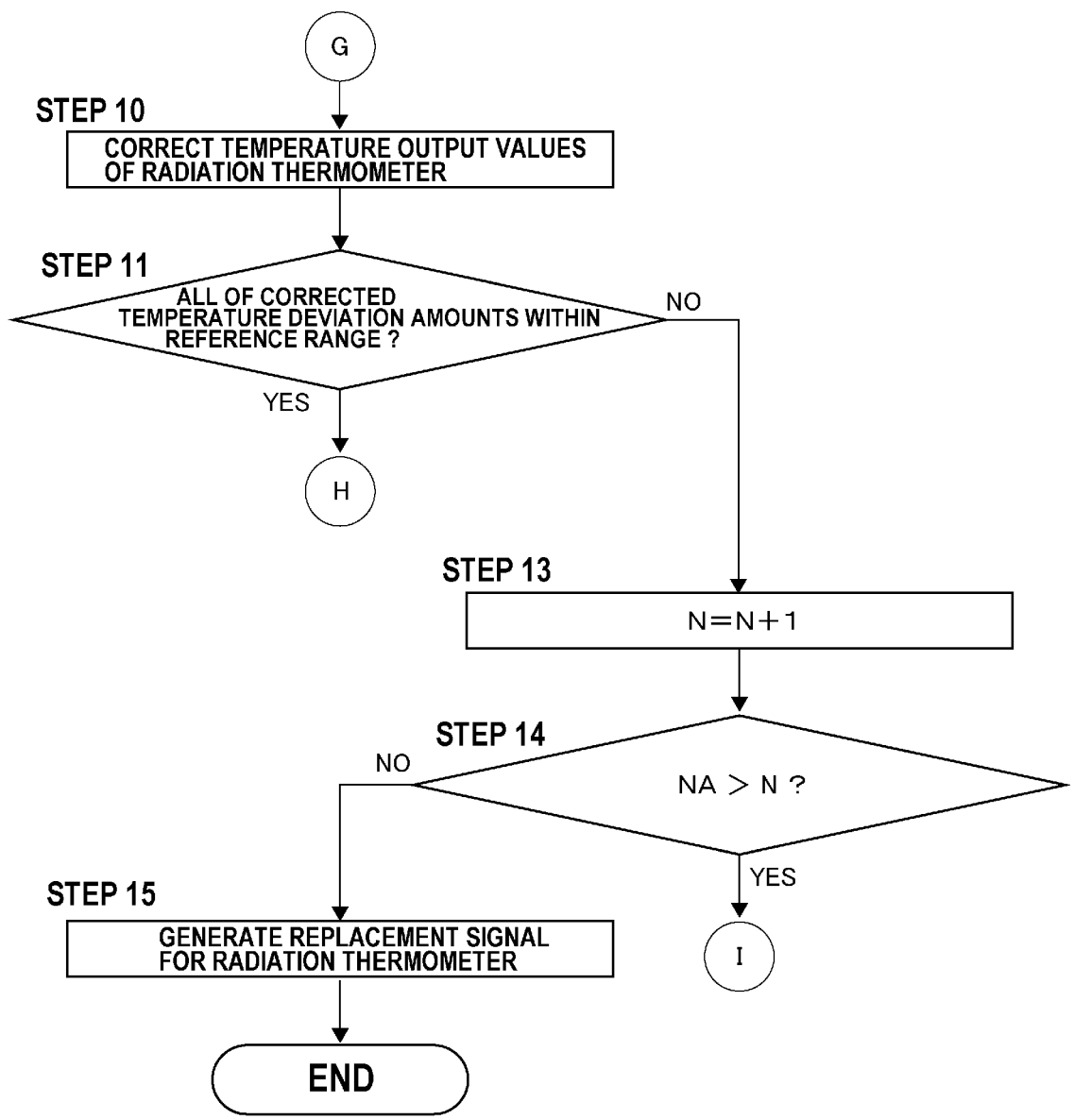
FIG. 21 is a flowchart showing a latter half of the method of performing the calibration of the radiation thermometer in the calibration system with the calibration tool shown in FIG. 18A.

FIG. 20 is a flowchart showing a first half of a method of performing the calibration of the second radiation thermometer 48 in a calibration system with the calibration tool 60 shown in FIG. 18A, and FIG. 21 is a flowchart showing a latter half of the method of performing the calibration of the second radiation thermometer 48 in the calibration system with the calibration tool 60 shown in FIG. 18A. The steps, which are not specifically described in the flowcharts shown in FIGS. 20 and 21, are the same as the steps in the flowcharts shown in FIGS. 7 and 8.

As shown in FIG. 20, in this embodiment also, the calibration tool 60 is placed on the upper surface of the polishing pad 3 so that the heating plate 61a of the heating device 61 faces the sensor unit 48a of the second radiation thermometer 48 (step 1 in FIG. 20), and further the temperature regulator 66 of the calibration system is connected to the controller 40 of the polishing apparatus (step 2 in FIG. 20).

The controller 40 stores in advance the predetermined target temperature Tx, which is set for performing the calibration of the second radiation thermometer 48. Although the predetermined target temperature Tx can be set freely, it is preferable that the predetermined target temperature Tx is set to the target temperature of the polishing pad 3 in a frequently used polishing process. The controller 40 heats the temperatures of the heating plate 61a and the plurality of measurement bodies 68A-68D of the calibration tool 60 placed on the polishing pad 3 to the predetermined target temperature Tx through the temperature regulator 66 (step 3 in FIG. 20).

Next, the controller 40 operates the moving mechanism 74 to move one measurement body 68A among the plurality of measurement bodies 68A through 68D below the second radiation thermometer 48, and measures the temperature of the measurement body 68A with the second radiation thermometer 48 (step 4 in FIG. 20). Then, the controller 40 stores the temperature output value output from the second radiation thermometer 48 (step 5 in FIG. 20).

Next, the controller 40 determines whether or not the temperatures of all the measurement bodies 68A through 68D are measured (step 6 in FIG. 20). When the temperatures of all the measurement bodies 68A through 68D are not measured ("No" in step 6 of FIG. 20), the controller 40 operates the moving mechanism 74 to move the next measurement body 68B below the second radiation thermometer 48 (step 7 of FIG. 20). Further, the controller 40 measures the temperature of the measurement body 68B with the second radiation thermometer 48 (step 4 in FIG. 20), and stores the temperature output value output from the second radiation thermometer 48 (step 5 in FIG. 20).

When the measurement of the temperatures of all measurement bodies 68A through 68l) is completed ("Yes" in step 6 of FIG. 20), the controller 40 calculates the temperature deviation amount in each of the plurality of measurement bodies 68A through 68l) (step 8 of FIG. 20). In this embodiment, the temperature deviation amount is a difference between each temperature expectation value Ma through Md, and the temperature output value of each measurement body 68A through 68D output from the second radiation thermometer 48. For example, the temperature deviation amount in the measurement body 68A is the difference between the temperature expectation value Ma (100° C. in FIG. 19) and the temperature output value of the second radiation thermometer 48 for the measurement body 68A, and the temperature deviation amount in the measurement body 68A is the difference between the temperature expectation value Md (103.2° C. in FIG. 19) and the temperature output value of the second radiation thermometer 48 for the measurement body 68A. Next, the controller 40 determines whether or not all of the temperature deviation amounts are within the reference range (step 9 in FIG. 20). The reference range for the temperature deviation amounts is preset, and stored in the controller 40 in advance.

When there is any temperature deviation amount that exceeds the reference range ("No" in step 9 of FIG. 20), the controller 40 corrects the temperature output values from the second radiation thermometer 48 so that all the temperature deviation amounts are within the reference range (step 10 in FIG. 21). The correction of the temperature output values may be performed by the correction of the conversion parameters stored in the analog-digital converter 48c of the second radiation thermometer 48, or by the correction of the parameters of the conversion formula stored in the conversion unit 48e of the second radiation thermometer 48.

In this embodiment also, the calibration operation of the second radiation thermometer performed by the controller 40 corresponds to the operation shown in step 3 through step 10. The controller 40 measures the temperatures of the plurality of measurement bodies 68A through 68D heated to the predetermined target temperature Tx with the second radiation thermometer 48, and calculates the temperature deviation amounts for each measurement body. Further, the controller 40 corrects the conversion parameters stored in the analog-digital converter 48c of the second radiation thermometer 48 (or the parameters of the conversion formula stored in the conversion unit 48e) so that all the temperature deviation amounts are within the reference range.

The controller 40 preferably checks whether all the temperature deviation amounts for each measurement bodies 68A through 68D after the correction are within the reference range (step 11 in FIG. 21). Specifically, the controller 40 again measures all of the temperatures of the measurement bodies 68A through 68D, each of which is maintained at the predetermined target temperatures Tx, with the second radiation thermometer 48, calculates the temperature deviation amounts for each of the measurement bodies 68A through 68D, and checks whether or not all the temperature deviation amounts are within the reference range. The operation shown in step 11 is a checking operation for determining whether or not the second radiation thermometer 48 has been reliably calibrated.

When all the corrected temperature deviation amounts are within the reference range, the controller 40 generates a signal for indicating that the calibration process of the second radiation thermometer 48 is completed (step 12 in FIG. 20). If, in the checking operation shown in step 11, there is any temperature deviation amount that exceeds the reference range ("No" in step 11 of FIG. 21), the controller 40 repeats the calibration operation shown in steps 3 through 10, and the checking operation shown in step IL Further, when the number of repetitions N reaches the upper limit NA ("No" in step 14 of FIG. 21), the controller 40 generates a signal for prompting a replacement of the second radiation thermometer 48 (step 15 in FIG. 21).

In this embodiment, it is not necessary to heat the heating plate 61A and the measurement bodies 68A to 68D to multiple target temperatures in order to perform the calibration of the second radiation thermometer 48. In other words, it is only necessary to heat the heating plate 61*a* and the measurement bodies 68A to 68D to one target temperature Tx, and then maintain them at the target temperature Tx. Therefore, a time required for the calibration of the second radiation thermometer 48 can be shortened, and thus a downtime of the polishing apparatus can be greatly reduced. Further, the controller 40 maintains the temperatures of the measurement bodies 68A to 68D at the target temperature Tx until the checking operation is completed even after the calibration operation is completed. Therefore, the checking operation can be performed immediately after the calibration operation is completed.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to a method and a system of automatically calibrating a radiation thermometer disposed in a polishing apparatus.

REFERENCE SIGNS LIST

1 polishing head
2 polishing table
3 polishing pad
5 pad-temperature regulating apparatus
11 heat exchanger
30 liquid supply system
39 (first) radiation thermometer
40 controller
48 (second) radiation thermometer
60 calibration tool
61 heating device
63 platform
65 cooling device
66 temperature regulator
68 measurement body
68A, 68B, 68C, 68D measurement body
74 moving mechanism (measurement-body moving mechanism)
75 X-axis moving mechanism
76 Y-axis moving mechanism
80 moving mechanism (heating-device moving mechanism)
82 motor

The invention claimed is:

1. A method of automatically calibrating a radiation thermometer disposed in a polishing apparatus, comprising:
    placing a heating device, to which a measurement body is attached, below the radiation thermometer; and
    using a controller of the polishing apparatus, the controller being coupled to the heating device, to:
        heat the measurement body to a plurality of target temperatures,
        measure the temperatures of the measurement body at each target temperature with the radiation thermometer,
        calculate temperature deviation amounts which are differences between each of the plurality of target temperatures and temperature output values of the radiation thermometer corresponding to each target temperature, and
        calibrate the radiation thermometer so that all of the temperature deviation amounts are within a preset reference range.

2. The method according to claim 1, wherein calibrating the radiation thermometer is correcting a conversion parameter stored in an analog-digital converter of the radiation thermometer.

3. The method according to claim 1, further comprising:
    after calibrating the radiation thermometer, heating again the temperature of the measurement body to the plurality of target temperatures;
    measuring the temperature of the measurement body at each target temperature with the radiation thermometer;
    calculating again the temperature deviation amounts; and
    checking whether or not all of the temperature deviation amounts are within the preset reference range.

4. The method according to claim 1, wherein the measurement body is made of a material having an emissivity similar to an emissivity of a polishing pad which is disposed in the polishing apparatus and whose temperature is measured by the radiation thermometer.

5. A method of automatically calibrating a radiation thermometer disposed in a polishing apparatus, comprising:
    preparing a plurality of heating devices each of which has a measurement body attached thereto; and
    using a controller of the polishing apparatus, the controller being coupled to the plurality of heating devices, to:
        heat each measurement body to a predetermined target temperature,
        move each measurement body below the radiation thermometer to measure a temperature of each measurement body at the predetermined target temperature with the radiation thermometer,
        calculate temperature deviation amounts which are differences between the predetermined target temperature and a corresponding temperature output value of the radiation thermometer, and
        calibrate the radiation thermometer so that all of the temperature deviation amounts are within a preset reference range.

6. A method of automatically calibrating a radiation thermometer disposed in a polishing apparatus, comprising:
    placing a heating device, to which a plurality of measurement bodies having known emissivities different from each other are attached, below the radiation thermometer; and
    using a controller of the polishing apparatus, the controller being coupled to the heating device, to:
        heat the plurality of measurement bodies to a predetermined target temperature,
        measure, with the radiation thermometer, the temperatures of the plurality of measurement bodies heated to the predetermined target temperature, respectively,
        calculate temperature deviation amounts which are differences between each temperature expectation value to be output from the radiation thermometer when the measurement bodies that are heated to the predetermined target temperature are measured by the radiation thermometer, and each temperature output value of the radiation thermometer, and calibrate the radiation thermometer so that all of the temperature deviation amounts are within a preset reference range.

7. The method according to claim 6, wherein calibrating the radiation thermometer is correcting a conversion parameter stored in an analog-digital converter of the radiation thermometer.

8. The method according to claim 6, further comprising:
after calibrating the radiation thermometer, measuring again the temperatures of the plurality of measurement bodies, whose temperature are maintained at the predetermined target temperature, with the radiation thermometer;
calculating again the temperature deviation amounts; and
checking whether or not all of the temperature deviation amounts are within the preset reference range.

9. A calibration system for calibrating a radiation thermometer disposed in a polishing apparatus, comprising:
a heating device to which a measurement body is attached, and which is placed below the radiation thermometer; and
a temperature regulator coupled to the heating device,
wherein the temperature regulator is coupled to a controller disposed in the polishing apparatus, and
the controller is configured to:
heat the measurement body to a plurality of target temperatures through the temperature regulator,
measure the temperatures of the measurement body at each target temperature with the radiation thermometer,
calculate temperature deviation amounts which are differences between each of the target temperatures and temperature output values of the radiation thermometer corresponding to each target temperature, and
calibrate the radiation thermometer so that all of the temperature deviation amounts are within a preset reference range.

10. The calibration system according to claim 9, wherein the controller is configured to correct a conversion parameter stored in an analog-digital converter of the radiation thermometer.

11. The calibration system according to claim 9, wherein the controller is configured
to, after calibrating the radiation thermometer, heat again the measurement body to the plurality of target temperatures;
to measure the temperature of the measurement body at each target temperature with the radiation thermometer;
to calculate again the temperature deviation amounts; and
to check whether or not all of the temperature deviation amounts are within the preset reference range.

12. The calibration system according to claim 9, wherein the measurement body is made of a material having an emissivity similar to an emissivity of a polishing pad which is disposed in the polishing apparatus and whose temperature is measured by the radiation thermometer.

13. A calibration system for calibrating a radiation thermometer disposed in a polishing apparatus, comprising:
a plurality of heating devices each of which has a measurement body attached thereto;
a temperature regulator coupled to the plurality of heating devices, and a heating-device moving mechanism configured to move each of the plurality of heating devices below the radiation thermometer,
wherein the temperature regulator and the heating-device moving mechanism are coupled to a controller disposed in the polishing apparatus, and
the controller is configured to:
heat each measurement body to a predetermined target temperature,
use the heating-device moving mechanism to move each measurement body below the radiation thermometer,
measure the temperature of each measurement body at the predetermined target temperature with the radiation thermometer,
calculate temperature deviation amounts which are differences between each of the predetermined target temperatures and temperature output values of the radiation thermometer corresponding to each predetermined target temperature, and
calibrate the radiation thermometer so that all of the temperature deviation amounts are within a preset reference range.

14. A calibration system for calibrating a radiation thermometer disposed in a polishing apparatus, comprising:
a heating device to which a plurality of measurement bodies having known emissivities different from each other are attached, and which is placed below the radiation thermometer; and
a temperature regulator coupled to the heating device,
wherein the temperature regulator is coupled to a controller disposed in the polishing apparatus, and
the controller is configured to:
heat temperatures of the plurality of measurement bodies to a predetermined target temperature,
measure, with the radiation thermometer, the temperatures of the plurality of measurement bodies heated to the predetermined target temperature, respectively,
calculate temperature deviation amounts which are differences between each temperature expectation value to be output from the radiation thermometer when the measurement bodies that are heated to the predetermined target temperature are measured by the radiation thermometer, and each temperature output value of the radiation thermometer, and
calibrate the radiation thermometer so that all of the temperature deviation amounts are within a preset reference range.

15. The calibration system according to claim 14, wherein the controller is configured to correct a conversion parameter stored in an analog-digital converter of the radiation thermometer.

16. The calibration system according to claim 14, wherein the controller is configured to:
after calibrating the radiation thermometer, heat the plurality of measurement bodies to the predetermined target temperature;
measure again the temperature of the plurality of measurement bodies whose temperatures are maintained at the predetermined target temperature, with the radiation thermometer;
calculate again the temperature deviation amounts; and
check whether all of the temperature deviation amounts are within the preset reference range.

* * * * *